United States Patent
Weida et al.

(10) Patent No.: US 9,496,674 B2
(45) Date of Patent: Nov. 15, 2016

(54) RAPIDLY TUNABLE LASER ASSEMBLY

(71) Applicant: Daylight Solutions, Inc., San Diego, CA (US)

(72) Inventors: Miles James Weida, Poway, CA (US); David F. Arnone, Mountain View, CA (US); Eric Kim, San Diego, CA (US); Edeline Fotheringham, San Diego, CA (US)

(73) Assignee: DAYLIGHT SOLUTIONS, INC., San Diego, CA (US)

( * ) Notice: Subject to any disclaimer, the term of this patent is extended or adjusted under 35 U.S.C. 154(b) by 719 days.

(21) Appl. No.: 14/012,612

(22) Filed: Aug. 28, 2013

(65) Prior Publication Data
US 2016/0301187 A1    Oct. 13, 2016

Related U.S. Application Data

(60) Provisional application No. 61/694,160, filed on Aug. 28, 2012.

(51) Int. Cl.
| H01S 3/08 | (2006.01) |
| H01S 3/082 | (2006.01) |
| H01S 3/139 | (2006.01) |

(52) U.S. Cl.
CPC ............. *H01S 3/08009* (2013.01); *H01S 3/08* (2013.01); *H01S 3/082* (2013.01); *H01S 3/08004* (2013.01); *H01S 3/139* (2013.01)

(58) Field of Classification Search
CPC .. H01S 3/08; H01S 3/08004; H01S 3/08009; H01S 3/082; H01S 3/0826; H01S 3/139
See application file for complete search history.

(56) References Cited

U.S. PATENT DOCUMENTS

| 6,134,257 A | 10/2000 | Capasso et al. |
| 6,282,215 B1 | 8/2001 | Zorabedian et al. |
| 6,400,744 B1 | 6/2002 | Capasso et al. |
| 7,424,042 B2 | 9/2008 | Day et al. |
| 7,466,734 B1 | 12/2008 | Day et al. |
| 7,492,806 B2 | 2/2009 | Day et al. |
| 7,535,656 B2 | 5/2009 | Day et al. |
| 7,535,936 B2 | 5/2009 | Day et al. |
| 7,733,925 B2 | 6/2010 | Pushkarsky et al. |
| 7,796,341 B2 | 9/2010 | Day et al. |
| 7,826,503 B2 | 11/2010 | Day et al. |
| 7,848,382 B2 | 12/2010 | Weida et al. |
| 7,873,094 B2 | 1/2011 | Day et al. |
| 7,920,608 B2 | 4/2011 | Marsland, Jr. et al. |
| 8,027,094 B2 | 9/2011 | Day et al. |
| 8,050,307 B2 | 11/2011 | Day et al. |
| 8,068,521 B2 | 11/2011 | Weida et al. |
| 8,189,630 B2 | 5/2012 | Marsland, Jr. et al. |
| 8,306,077 B2 | 11/2012 | Pushkarsky et al. |
| 8,335,413 B2 | 12/2012 | Dromaretsky et al. |
| 8,442,081 B2 | 5/2013 | Marsland, Jr. et al. |
| 8,467,430 B2 | 6/2013 | Caffey et al. |
| 8,565,275 B2 | 10/2013 | Pushkarsky et al. |

*Primary Examiner* — Armando Rodriguez
(74) *Attorney, Agent, or Firm* — Roeder & Broder LLLP; Steven G. Roeder

(57) ABSTRACT

A laser assembly for generating an output beam includes a first module assembly, a second module assembly, and a module fastener assembly. The second module assembly is selectively movable relative to the first module assembly to selectively adjust a cavity length, and a pivot axis of a grating in the laser. Further, an arm assembly that retains the grating can be adjusted to adjust the cavity length, and to adjust the plane of the grating face. Moreover, the grating is movable relative to the arm assembly to align the grating.

17 Claims, 16 Drawing Sheets

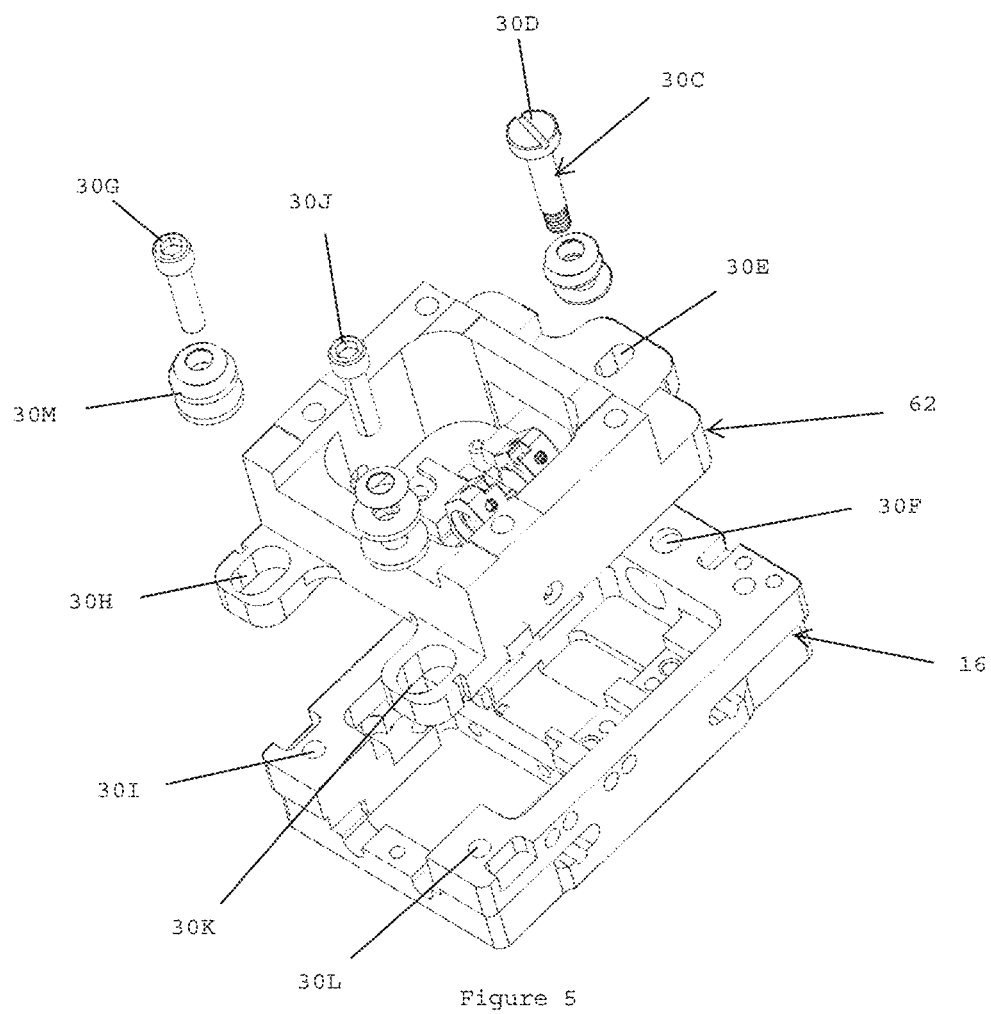

RAPIDLY TUNABLE LASER ASSEMBLY

RELATED INVENTION

As far as permitted, the contents of U.S. Provisional Application Ser. No. 61/655,244, filed on Jun. 4, 2012, and entitled "Laser Assembly with Thermal Control and Mechanically Stable Mounting" are incorporated herein by reference. Further, as far as permitted, the contents of U.S. Pat. No. 7,733,925, and entitled "CONTINUOUS WAVELENGTH TUNABLE LASER ASSEMBLY WITH OPTIMUM POSITIONING OF PIVOT AXIS FOR GRATING", with issued on Jun. 8, 2010 are incorporated herein by reference.

This application claims priority on U.S. Provisional Application No. 61/694,160, filed Aug. 28, 2012, and entitled "RAPIDLY TUNABLE LASER ASSEMBLY." As far as permitted, the contents of U.S. Provisional Application No. 61/694,160 are incorporated herein by reference.

GOVERNMENT LICENSE RIGHTS

This invention was made with government support under W911 QX-10-C-0102 awarded by the Air Force. The government has certain rights in the invention.

BACKGROUND

Lasers sources are useful in many applications. For example, laser assemblies that generate light in the mid infrared ("MIR") range are useful for absorption spectroscopy applications since many gases of interest have their fundamental vibrational modes in the MIR range, and thus present strong, unique absorption signatures within the MIR range.

Unfortunately, many existing laser assemblies are not capable of accurately and rapidly generating light over a broad spectral range.

SUMMARY

The present invention is directed to a laser assembly for emitting an output beam that includes a set of output pulses of energy, with at least some of the output pulses of energy having a different center wavelength. In one embodiment, the laser assembly includes a first module assembly, a second module assembly, and a module fastener assembly. The first module assembly includes (i) a rigid first frame; and (ii) a gain medium coupled to the first frame, the gain medium having a first facet and a second facet, the gain medium generating a beam that exits the facets along a lasing axis when sufficient current is directed to the gain medium. The second module assembly includes (i) a rigid second frame; (ii) a diffraction grating positioned in the path of the beam exiting the first facet to form an external cavity having a cavity length, the diffraction grating redirecting at least a portion of the beam back to the gain medium, the diffraction grating having a grating face and grating grooves; (iii) an arm assembly that retains the grating; (iv) a pivot assembly that secures the arm assembly to the second frame in a fashion that allows the arm assembly and the grating to effectively pivot about a pivot axis; and (v) a mover that selectively moves the arm assembly and grating about the pivot axis. The module fastener assembly is moveable between (i) an unlocked ("movable") position in which the second frame can be selectively moved relative to the first frame to selectively adjust the cavity length, and to adjust the pivot axis (adjust pivot axis yaw) to be approximately normal to the lasing axis; and (ii) a locked position in which the second module assembly is fixedly secured to the first module assembly to inhibit relative movement between the first frame and the second frame.

In one embodiment, the arm assembly includes (i) a proximal arm section that is secured to the second frame with the pivot assembly; (ii) a distal arm section that retains the diffraction grating; and (iii) an arm connector assembly that is moveable between an unlocked ("movable") position in which the distal arm section can be moved relative to the proximal arm section to adjust the plane of the grating face so that the grating face is properly aligned with the pivot axis; and a locked ("tightened") position in which the distal arm section is fixedly secured to the proximal arm section to inhibit relative movement between the distal arm section and the proximal arm section.

Moreover, the second module assembly can include a grating fastener assembly that allows the grating to be rotated to align the grating grooves (adjust grating yaw) of the grating to the arm assembly, and a fixed a locked ("tightened") position in which the grating is fixedly secured to the distal arm section to inhibit relative movement between the grating and the distal arm section.

Accordingly, with the present design, (i) roll and yaw can be adjusted, (ii) yaw can be adjusted in two positions to allow for complete yaw adjustment, (iii) pivot axis yaw and grating yaw can be adjusted independently. Stated in another fashion, the four degrees of freedom that can be adjusted with regards to the external cavity (all with external tooling in certain embodiments) are as follows: (i) alignment of the grating grooves of the grating relative to the arm assembly; (ii) the alignment/rotation of the distal arm section relative to the proximal arm section and the pivot axis; (iii) alignment/the rotation of pivot axis relative to the first module assembly around the Y axis; and (iv) adjustment of the cavity length because the second module assembly slides relative to the first module assembly.

As provided herein, continuous wavelength tuning without mode hops is accomplished by proper motion of a diffraction grating with respect to the gain medium. More specifically, the proper motion of the grating can be realized either by the rotation of the grating with respect to the properly selected pivot axis. Further, the adjustments provided herein allow for the proper positioning of the pivot axis to achieve accurate, fine, and smooth tuning throughout the spectral range without the influence of the cavity modes.

In one embodiment, the mover includes a first mover component that is coupled to the arm assembly and a second mover component that is coupled to the second frame, wherein current directed to one of the mover components causes the first mover component and the arm assembly to move relative to the second frame. For example the mover can be a voice coil motor. With the present invention, the mover can be controlled to pivot the arm assembly (and grating) back and forth in a simple harmonic motion.

Additionally, the laser assembly can include a temperature controller that is in thermal communication with the first frame. With this design, the temperature controller can control the temperature of the first frame and the gain medium.

In one embodiment, the laser assembly also includes a cavity optical assembly positioned between the gain medium and the grating, with the cavity optical assembly having an optical axis. In this embodiment, the pivot axis can be located approximately in a pivot plane that is normal to the optical axis, the pivot plane being spaced apart from the second facet a separation distance that is calculated using the following formula: separation distance=L_lens*(n_lens−1)+L_media*(n_gain−1); where L_lens is the physical length of the cavity collimator, n_lens is the group index of refraction of the cavity collimator, L_gain is the physical length of the gain medium, and n_gain is the group index of refraction of the gain medium.

In alternative, non-exclusive embodiments, the gain medium can have a physical length between the facets of approximately 1.5 millimeters; and laser assembly can be designed so that the external cavity has a physical length of less than approximately ten (10), twenty (20), thirty (30), forty (40), or fifty (50) millimeters.

In another embodiment, the present invention is directed to a laser assembly for emitting an output beam that includes a set of output pulses of energy, with at least some of the output pulses of energy having a different center wavelength. In this embodiment, the laser assembly includes: a first module assembly having (i) a rigid first frame; (ii) and a gain medium coupled to the first frame, the gain medium having a first facet and a second facet, the gain medium generating a beam that exits the facets along a lasing axis when sufficient current is directed to the gain medium; and a second module assembly having (i) a rigid second frame; (ii) a diffraction grating positioned in the path of the beam exiting the first facet to form an external cavity having a cavity length, the diffraction grating redirecting at least a portion of the beam back to the gain medium, the diffraction grating having a grating face and grating grooves; (iii) an arm assembly that retains the grating; (iv) a pivot assembly that secures the arm assembly to the second frame in a fashion that allows the arm assembly and the grating to effectively pivot about a pivot axis; and (v) a mover that selectively moves the arm assembly and grating about the pivot axis. In this embodiment, (i) the second module assembly is moveable relative to the first module assembly to selectively adjust the cavity length, and to adjust the pivot axis to be approximately normal to the lasing axis; (ii) the arm assembly includes a proximal arm section that is secured to the second frame with the pivot assembly, a distal arm section that retains the diffraction grating; and the distal arm section is movable relative to the proximal arm section to adjust the plane of the grating face so that the grating face is properly aligned with the pivot axis; and (iii) the grating is movable relative to the distal arm section to align the grating grooves of the grating to the arm assembly.

The present invention is also directed to a method for generating on output beam.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 5 is an exploded perspective view of another portion of the laser assembly of FIGS. 1A and 1B;

DESCRIPTION

Figure 1A:
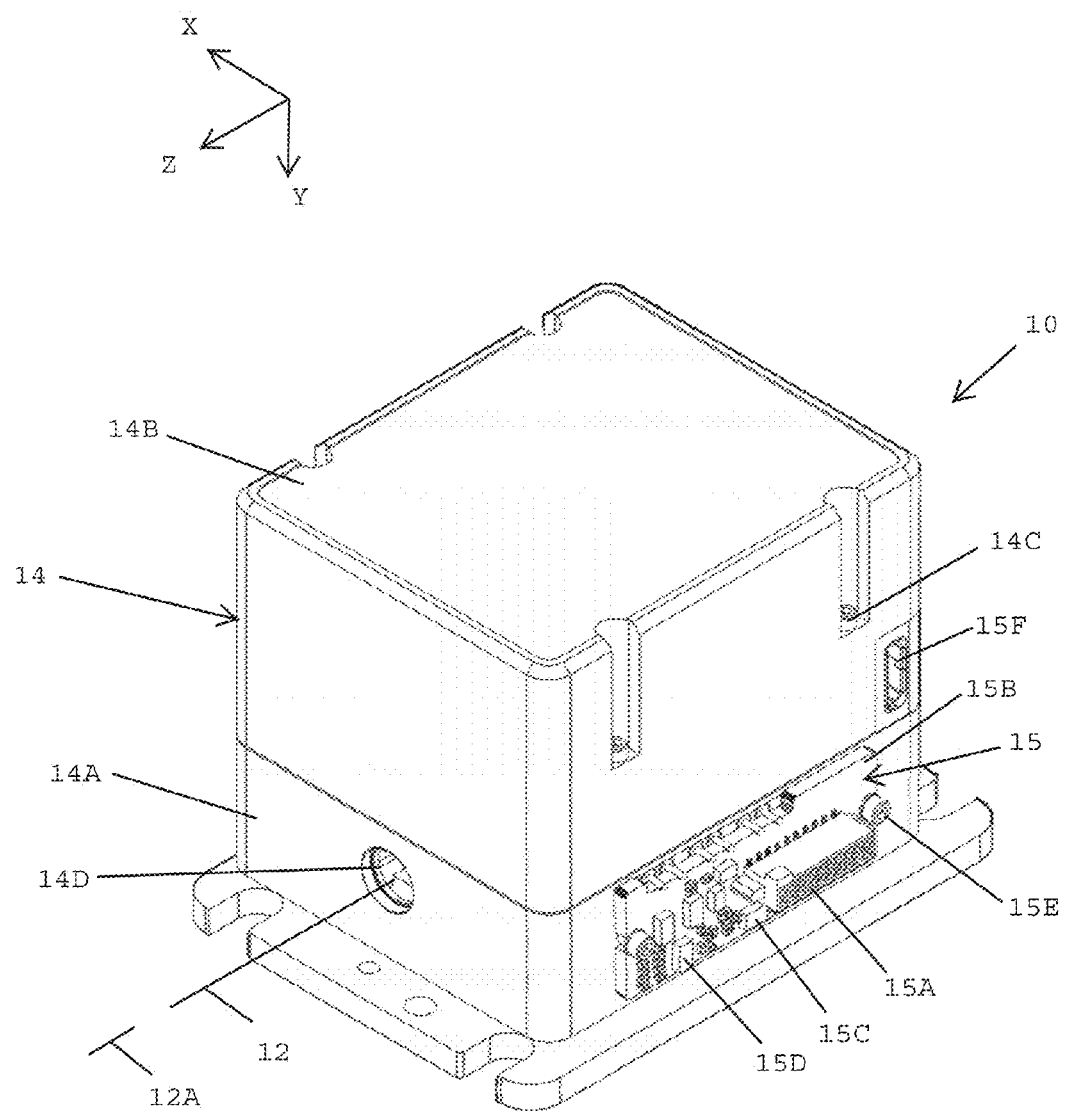
FIGS. 1A and 1B are alternative perspective views of a laser assembly having features of the present invention.
Figure 1B:
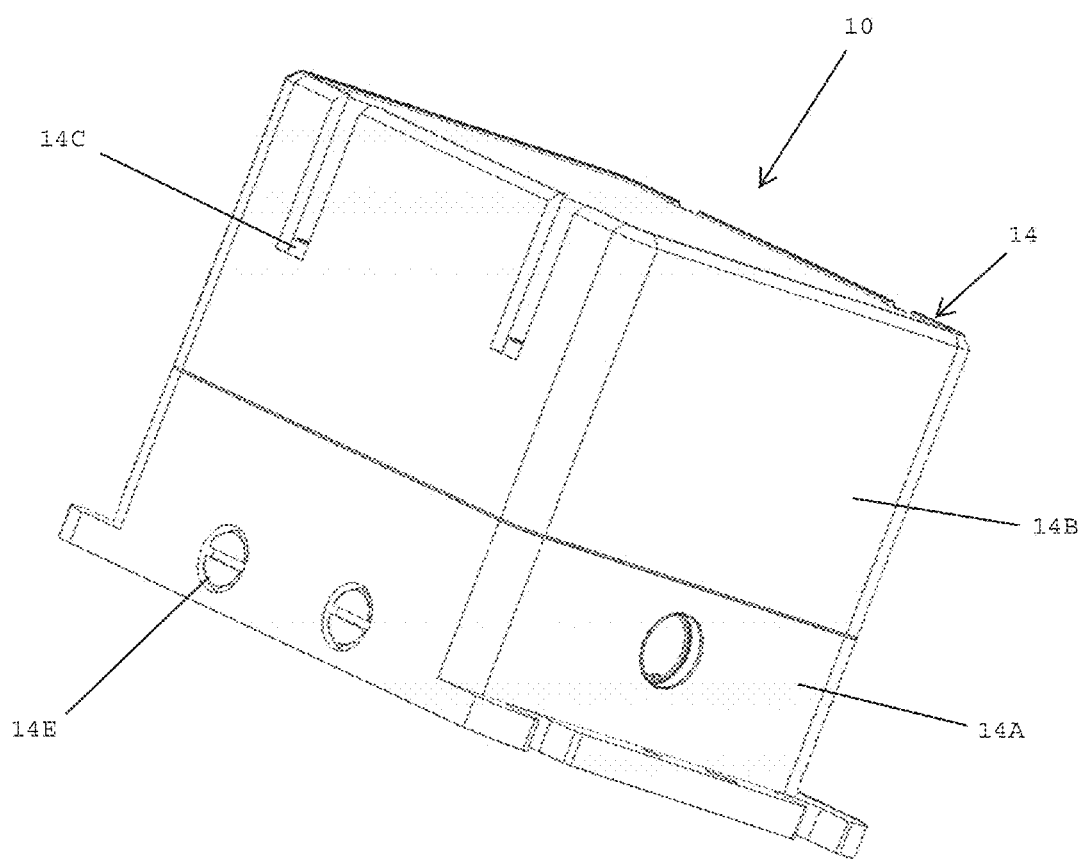
Figure 2A:
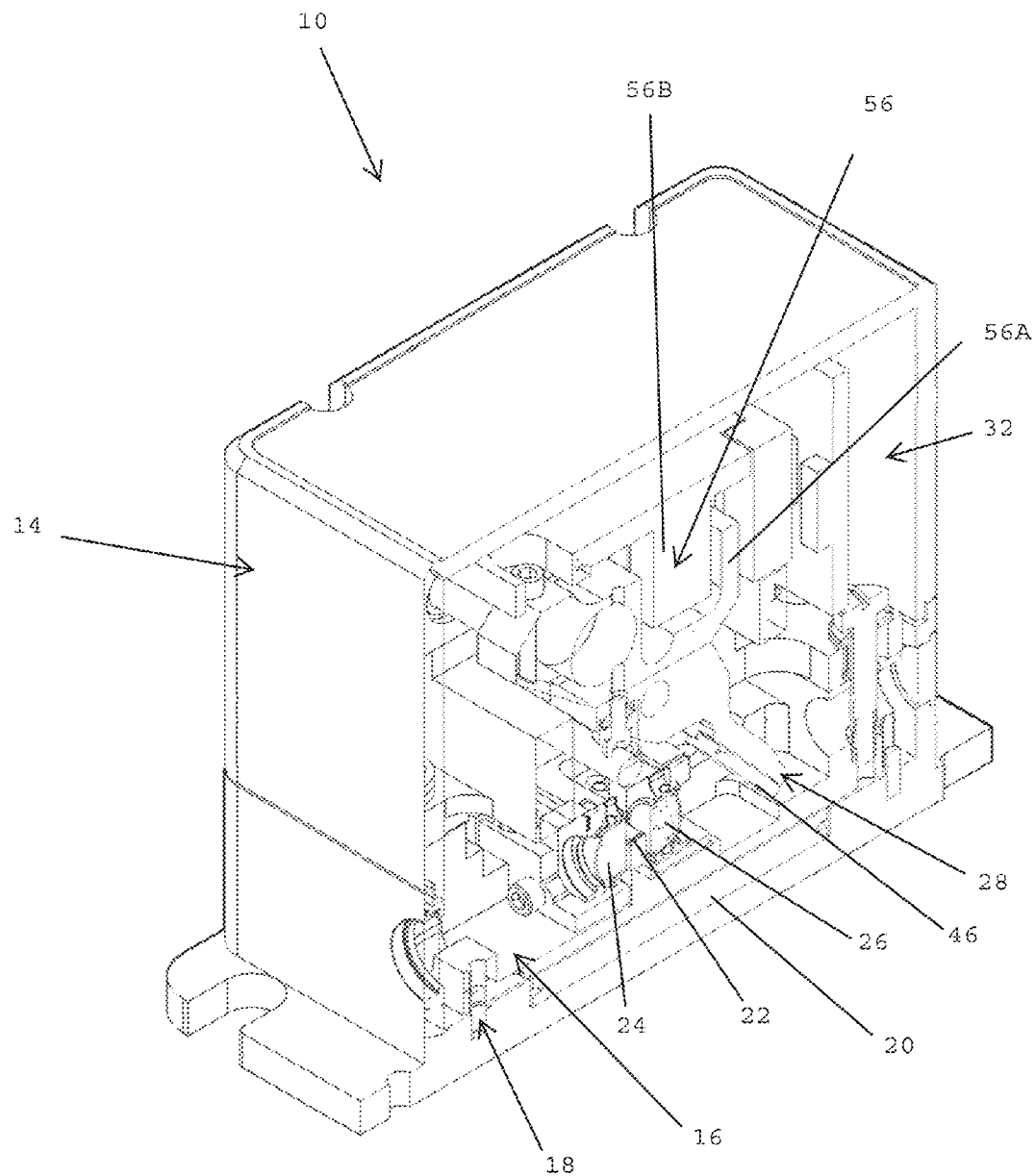
FIGS. 2A-2D are alternative, cut-away views of the laser assembly of FIGS. 1A and 1B.
Figure 2B:
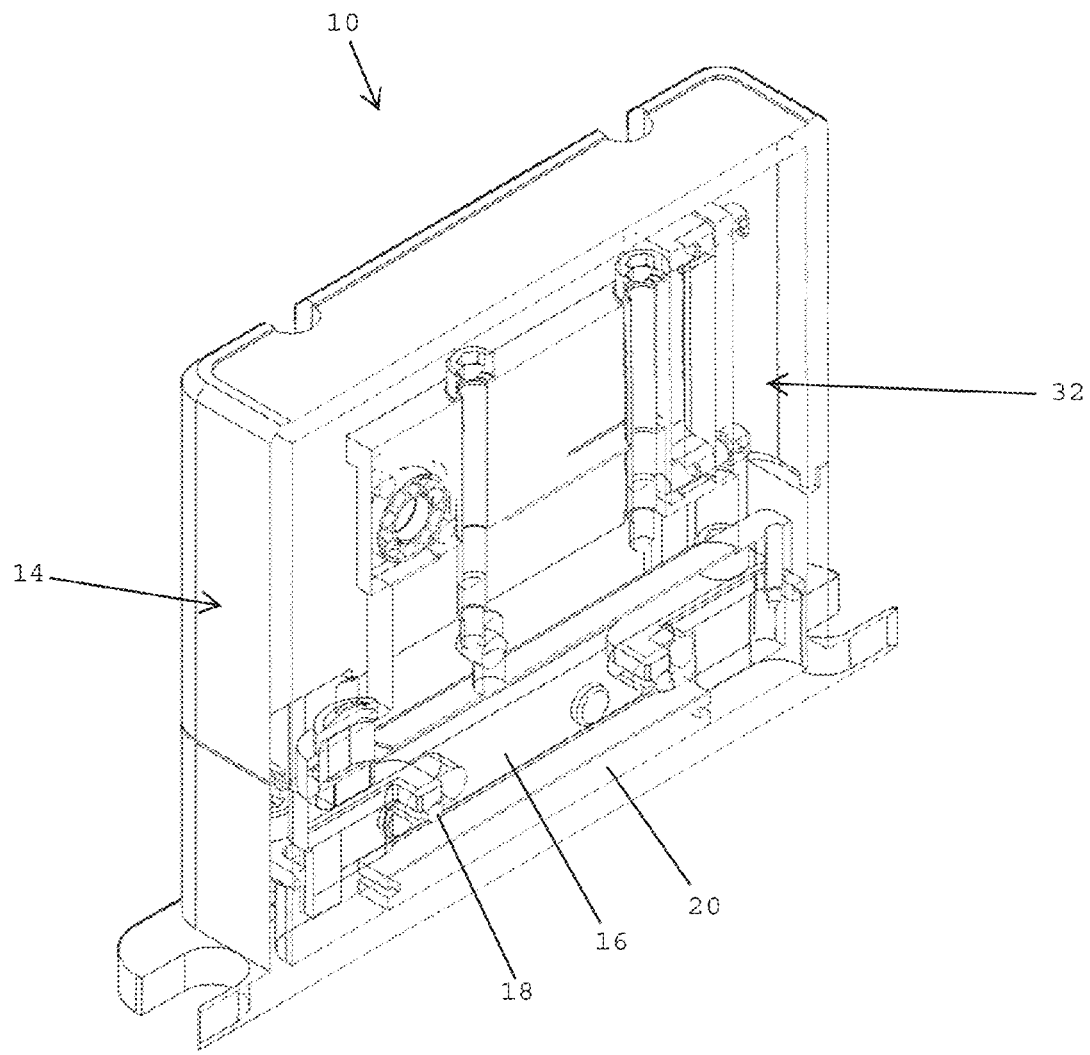
Figure 2C:
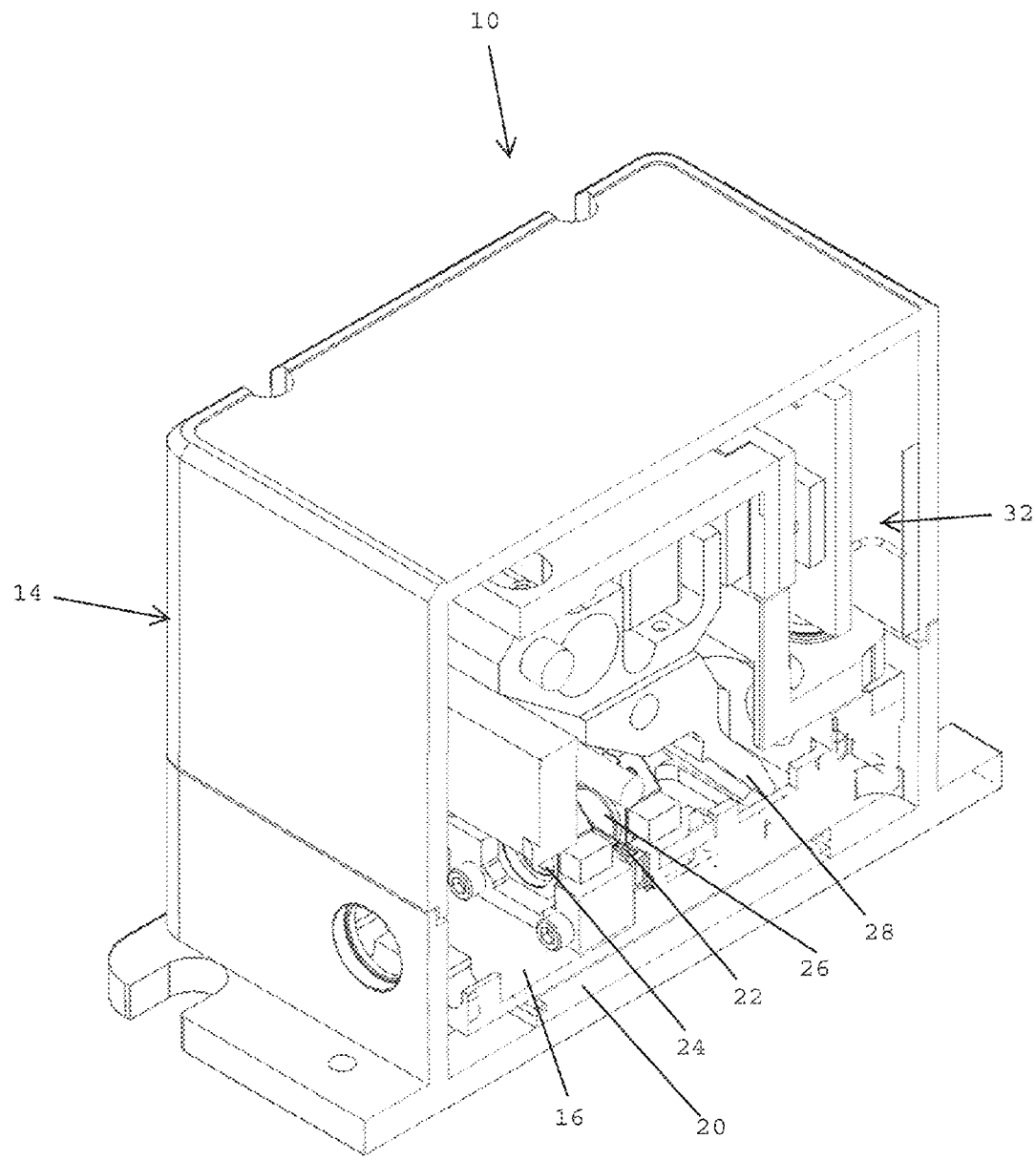
Figure 2D:
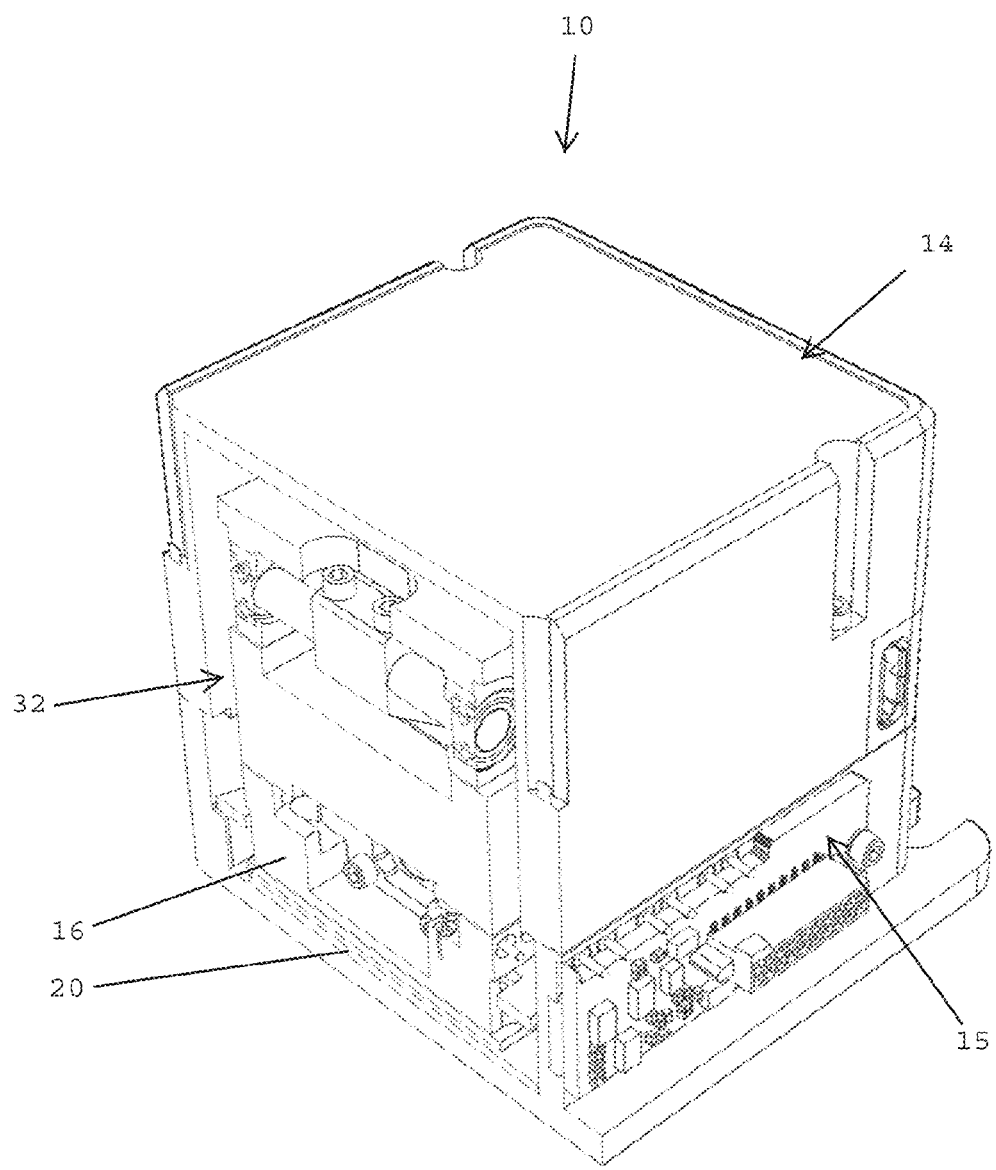

Referring initially to FIGS. 1A and 1B, the present invention is directed to a laser assembly 10 that generates an output beam 12. For example, the laser assembly 10 can be used for imaging, locating, detecting, and/or identifying a substance, e.g. an emitting gas (not shown) and/or other industrial or testing applications. In one, non-exclusive embodiment, the laser assembly 10 is designed to rapidly and accurately generate an output beam 12 directed along an output axis 12A. Further, in certain embodiments, the output beam 12 consists of one or more sets of sequential, wavelength specific output pulses of light (energy) that span a predetermined output wavelength range. Stated in another fashion, in certain embodiments, the laser assembly 10 is uniquely designed to provide an accurate output beam 12 that includes a set of sequential output pulses of light that span a relatively large, predetermine wavelength range, in a very fast time. In certain embodiments, the laser assembly 10 is designed to be essentially mode hop free when operated continuous wave ("CW"). Alternatively, the laser assembly 10 can be pulsed.

As provided herein, the laser assembly 10 is compact, broadly tunable, fast tuning, able to tune to a discrete wavelength, and quickly sweeps the wavelength range. With this present design, the laser assembly 10 is well suited for use with a spectrometer to provide a broad spectral sweep in a fast time because the results of the spectrometer are less influenced by heat, wind, dust, or other unstable atmospheric conditions that can distort the delivery and return paths of the output beam 12.

As provided herein, the output beam 12 from the laser assembly 10 can be specifically tailored to target the absorption features of the substance of interest. Stated in another fashion, the desired predetermined wavelength range can be varied to suit the absorption profile/detection range of the substance being located and/or identified. In certain embodiments, a relatively large wavelength range is necessary to achieve specificity when analyzing mixtures of chemicals. Further, the resolution between different spectral signatures for different chemicals increases as the spectral range that is being analyzed is increased, thus allowing individual components to be detected.

In one embodiment, the laser assembly 10 is designed so that the set of output pulses of light have a center wavelength in the mid-infrared range of approximately 2-20 micrometers. In this embodiment, the laser assembly 10 can be designed to generate an output beam 12 consisting of a set of sequential, specific output pulses of light that span the entire or just a portion of the mid-infrared range. Further, the laser assembly 10 is particularly useful in absorption spectroscopy applications since many gases of interest have strong, unique absorption signatures within the mid-infrared range. Alternatively, the laser assembly 10 can be designed to generate one or more output pulses of light having a center wavelength of greater than or lesser than 2-20 micrometers.

Some of the Figures include an orientation system that illustrates an X axis, a Y axis that is orthogonal to the X axis, and a Z axis that is orthogonal to the X and Y axes. It should be noted that these axes can also be referred to as the first, second and third axes. Additionally, the labeling of the orientation system is merely for purposes of reference and the orientation system as provided in the Figures is not intended to define the specific X, Y and Z axes. Rather, the X axis as utilized and/or described herein can be any axis that is parallel to the X axis on the orientation system, the Y axis as utilized and/or described herein can be any axis that is parallel to the Y axis on the orientation system, and the Z axis as utilized and/or described.

As an overview, in certain embodiments, the laser assembly 10 is an external cavity (EC), narrow linewidth, quantum cascade laser (QCL). With this design, the output beam 12 can be characterized by near-diffraction limited divergence, narrow linewidth and specific wavelengths in the MIR spectral range.

In certain embodiments, the laser assembly 10 is designed to be mounted to a rigid optical bench (not shown) with or without an additionally temperature controller (not shown) positioned between the laser housing 14 and the optical bench. Further, the temperature of the optical bench can be controlled. With this design, heat is transferred from the laser housing 14 to the optical bench to precisely control the temperature of the laser housing 14.

Moreover, in certain embodiments, the laser assembly 10 can include a housing mounting assembly (not shown) that secures the laser assembly 10 to the optical bench in a fashion that allows the laser assembly 10 to expand or contract without distortion, and while maintaining the alignment of the output beam 12.

The design of the laser assembly 10 can be varied to achieve the desired type of gas detection or other usage. In FIGS. 1A and 1B, a laser housing 14, and a control system 15 of the laser assembly 10 are visible. In this embodiment, the laser housing 14 includes a housing body 14A, a cover 14B, a cover fastener assembly 14C that selectively secures the cover 14B to the housing body 14A, a transparent window 14D that allows the output beam 12 to exit the laser housing 14, and one or more purge plugs 14E that allow for the purging of the laser assembly 10. The housing body 14A provides structural integrity, and contributes to the small size and portability of the laser assembly 10. For example, the housing body 14A can be fabricated from a single, monolithic structure made of aluminum, copper, copper-tungsten or other material having a sufficiently high thermal conductivity. The control system 15 can be used to control some of the components of the laser assembly 10. The control system 15 is described in more detail below.

FIGS. 2A-2D are alternative, cut-away views of the laser assembly 10 of FIGS. 1A and 1B. The major components of the laser assembly 10 illustrated in these Figures include (i) the laser housing 14 that houses and/or retains many of the components of the laser assembly 10, (ii) a mounting frame 16, (iii) a frame mounting assembly 18, (iv) a temperature controller 20, (v) a gain medium 22, (vi) an output optical assembly 24, (vii) a cavity optical assembly 26, (viii) a wavelength selective ("WS") feedback assembly 28, and (ix) the control system 15. The design of each of these components can be varied pursuant to the teachings provided herein. It should be noted that the laser assembly 10 can be designed with more or fewer components than described above. It should also be noted that the laser assembly 10 can be powered by a generator (not shown), a battery (not shown), or another power source (not shown).

In this embodiment, the mounting frame 16, the frame mounting assembly 18, the temperature controller 20, the gain medium 22, the output optical assembly 24, and the cavity optical assembly 26 are similar to the corresponding components described in U.S. Provisional Application Ser. No. 61/655,244. However, the WS feedback assembly 28 is different than that described in U.S. Provisional Application Ser. No. 61/655,244.

In one embodiment, the housing body 14A can made of a material having a relatively high coefficient of thermal conductivity (e.g. at least 150 watts/meter K) so that heat from the gain medium 22 can be readily transferred. In this embodiment, the housing body 14A and the cover 14B cooperate to form a rigid, generally hollow rectangular shaped box that defines a housing chamber 32 that can provide a controlled environment for the mounting frame 16, the frame mounting assembly 18, the temperature controller 20, the gain medium 22, the output optical assembly 24, the cavity optical assembly 26, and the WS feedback assembly 28. Further, the control system 15 is secured to the outside of the housing body 14A.

For example, the laser housing 14 can be hermetically sealed, or can be filled with a desired controlled environment (e.g. an inert gas), or the laser housing 14 can be subjected to vacuum.

Figure 3A:
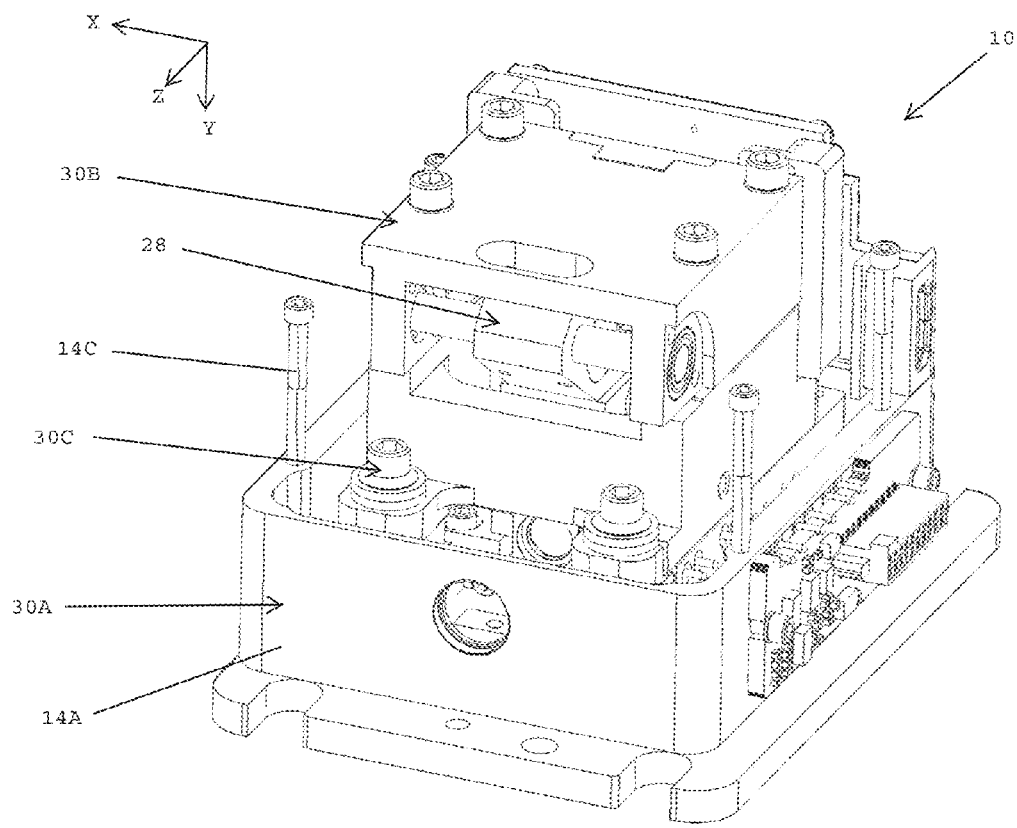
FIG. 3A is a perspective view of a portion of the laser assembly of FIGS. 1A and 1B.

FIG. 3A is a perspective view of the laser assembly 10 without the cover. In certain embodiments, the laser assembly 10 can be manufactured as a two piece modular system that includes (i) a first module assembly 30A; and (ii) a second module assembly 30B comprising the WS feedback assembly 28. Further, a module fastener assembly 30C can be used to fixedly secure the module assemblies 30A, 30B together. In certain embodiments, initially, the first module assembly 30A and the second module assembly 30B are independently assembled. Subsequently, the second module assembly 30A is properly aligned and secured to the first module assembly 30B with the module fastener assembly 30C. Finally, the cover can be secured to the housing body 14A with the cover fastener assembly 14C. As provided in more detail below, the present design provides a number of unique ways to assemble, position, and align the WS feedback assembly 28 to the rest of the laser assembly 10. This can allow for fine tuning and possible mode hop free operation of the laser assembly 10.

Figure 3B:
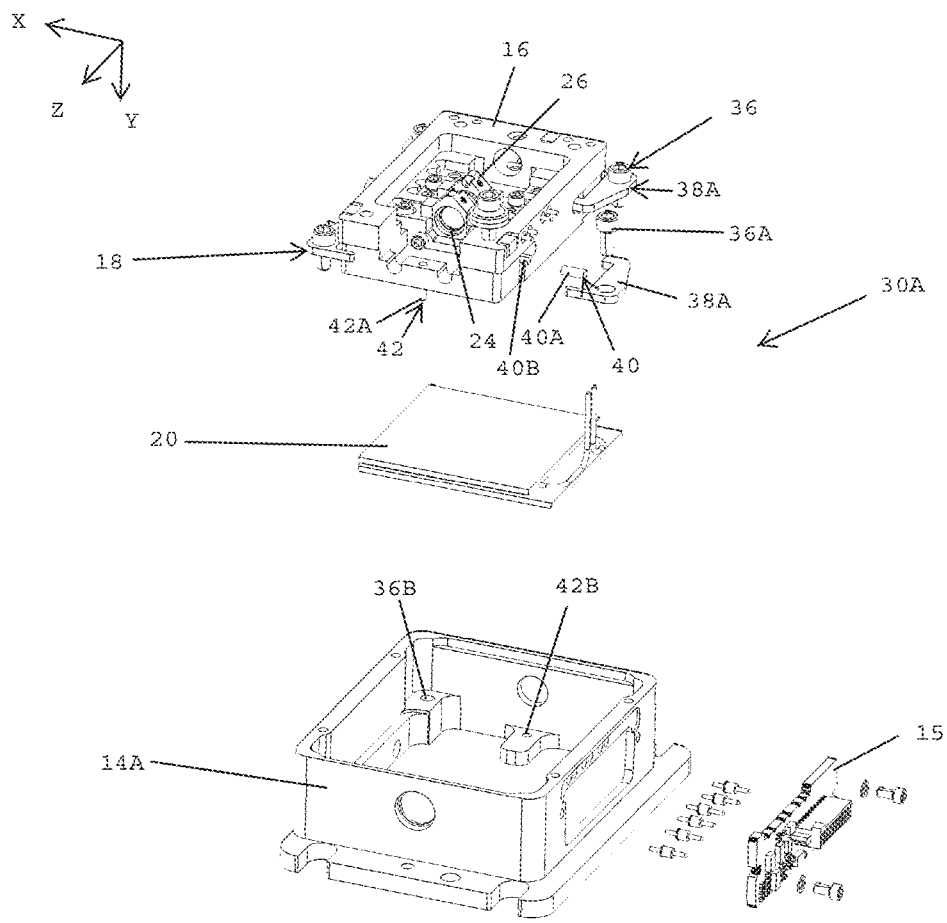
FIG. 3B is an exploded perspective view of the components of a first module assembly.

FIG. 3B is an exploded perspective view of a portion of the first module assembly 30A. In certain embodiments, the first module assembly 30A includes the housing body 14A, the mounting frame 16, the frame mounting assembly 18, the temperature controller 20, the gain medium (not visible in FIG. 3B), the output optical assembly 24, the cavity optical assembly 26, and control system 15.

The mounting frame 16 can be a monolithic structure that retains the gain medium, and the optical assemblies 24, 26 in a fixed, stable arrangement to maintain these components in precise mechanical alignment. Further, the mounting frame 16 can be made of a material having a relatively high coefficient of thermal conductivity (e.g. at least 150 watts/meter K) so that heat from the gain medium 22 can be readily transferred. For example, the mounting frame 16 can be fabricated from a single, monolithic structure made of aluminum, copper, copper-tungsten or other material having a sufficiently high thermal conductivity. The mounting frame 16 can also be referred to as a first frame or a second frame.

In one embodiment, the frame mounting assembly 18 secures the mounting frame 16 to the housing body 14A with the temperature controller 20 positioned therebetween. With this design, heat is transferred from the mounting frame 16 to the laser housing 14 via the temperature controller 20. In certain embodiments, the frame mounting assembly 18 secures the mounting frame 16 to the laser housing 14 in a fashion that allows the mounting frame 16 to expand or contract without distortion, and while maintaining the alignment of the output beam 12.

In one non-exclusive embodiment, the frame mounting assembly 18 resiliently urges the mounting frame 16 and the temperature controller 20 against the housing body 14A. In certain embodiments, the frame mounting assembly 18 secures the mounting frame 16 and the temperature controller 20 in a unique fashion that allows the mounting frame 16 to expand and contract relative to the temperature controller 20 and/or the housing body 14A (due to changes in temperature), while not distorting the mounting frame 16 and the gain medium, and while maintaining alignment of the components secured to the mounting frame 16.

In one embodiment, the frame mounting assembly 18 includes a fastener assembly 36, a mounting resilient assembly 38, a rod assembly 40, and an alignment assembly 42. In this non-exclusive embodiment, (i) the fastener assembly 36 includes four frame fasteners 36A, e.g., threaded bolts, with each fastener 36A being threaded into a corresponding internally threaded aperture 36B in the housing body 14A; (ii) the mounting resilient assembly 38 includes four resilient members 38A (e.g., spring steel beams); and (iii) the rod assembly 40 includes for two engagement rods 40A on each side positioned in grooves in the mounting frame 16. Alternatively, the frame mounting assembly 18 can be designed to include fewer than or greater than four fasteners 36A, fewer than or greater than four resilient members 38A, and/or fewer than or greater than four engagement rods 40A.

The fasteners 36A, the resilient members 38A, and the engagement rods 40A cooperate to resiliently urge the mounting frame 16 towards the housing body 14A with the temperature controller 20 positioned therebetween. In this embodiment, each resilient member 38A includes a proximal end and a distal end. Further, each fastener 36A extends through an aperture in the proximal end of one of the resilient members 38A and is threaded into the housing body 14A. Further, the distal end of each resilient member 38A urges a corresponding one of the engagement rods 40A against the mounting frame 16, i.e. into the grooves of the mounting frame 16.

With this design, (i) the flexing characteristics of the resilient members 38A can be tuned to specifically control the amount of force that is applied to mechanically hold the mounting frame 16 against the temperature controller 20 and the housing body 14A; (ii) the resilient members 38A provide a substantially uniform, non-bending pressure on the mounting frame 16 and the temperature controller 20; (iii) the pressure is applied by the resilient members 38A so as to minimize the likelihood of bending the mounting frame 16; (iv) an interface between resilient members 38A and the engagement rods 40A forms a line contact between the rods 40A and the resilient members 38A that minimizes the amount of heat transferred, i.e. that inhibits the transfer of heat, thereby providing thermal isolation; (v) the rods 40A can be made of electrically insulating sapphire (or another electrically insulating material) to provide electrical isolation; (iv) the arrangement of the engagement rods 40A allows the mounting frame 16 to expand or contract along the X axis and along the Y axis.

In one embodiment, the alignment assembly 42 maintains alignment of a portion of the laser assembly 10 along the X axis. In one embodiment, the alignment assembly 40 includes (i) a pair of alignment pins 42A (only one is visible in FIG. 3B) that are secured to the mounting frame 16 and that are spaced apart along the Z axis; and (ii) an alignment resilient assembly (not shown in drawings) that resiliently urges the mounting frame 16 along the X axis against the alignment pins 42A. In this embodiment, each alignment pin 42A fits through a corresponding frame aperture 42B (only one is visible) (the two are aligned and spaced apart along the Z axis) in the mounting frame 16. In certain embodiments, each frame aperture 42B is larger in diameter than the cross-section of the corresponding alignment pin 42A. Further, for example, each alignment pin 42A can have a non-circular shaped cross-section, e.g. a "D" shaped, square shaped, diamond shaped, octagon shaped, or hexagon shaped cross-section. With this design, when the alignment resilient assembly urges the mounting frame 16 along the X axis against the alignment pins 42A, and each alignment pin 42A has two spaced apart points of contact with the mounting frame 16. This will provide precision alignment of the mounting frame 16 oriented along the preferred optical axis.

The temperature controller 20 can control the temperature of the gain medium 22 and the temperature of the mounting frame 16. In one non-exclusive embodiment, the temperature controller is a thermoelectric cooler ("TEC") that has approximately the same footprint as the bottom of the mounting frame 16. With this design, the laser assembly 10 incorporates is own thermal management system and the cavity path length is thermally managed.

Figure 3C:
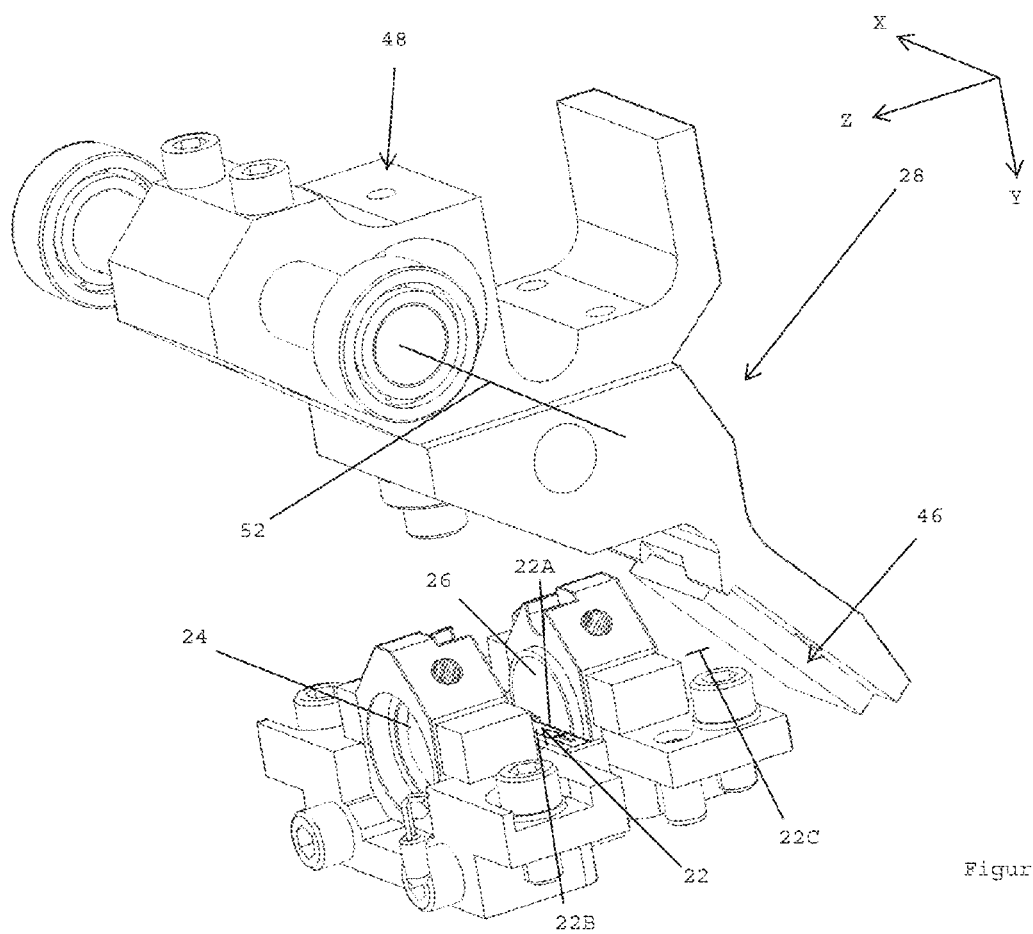
FIG. 3C is a perspective view of a portion of the laser assembly.

FIG. 3C is a perspective view that illustrates the gain medium 22, the optical assemblies 24, 26 and a portion of the WS feedback assembly 28. In one embodiment, the gain medium 22 is a quantum cascade ("QC") gain medium. Further, the QC gain medium 22 can use two different semiconductor materials such as InGaAs and AlInAs (grown on an InP or GaSb substrate for example) to form a series of potential wells and barriers for electron transitions. The thickness of these wells/barriers determines the wavelength characteristic of the QC gain medium 22.

As used herein, the term QC gain medium 22 shall also include Interband Cascade Lasers (ICL). ICL lasers use a conduction-band to valence-band transition as in the traditional diode laser. In one, non-exclusive embodiment, the semiconductor QCL laser chip is mounted epitaxial growth side down and has a length of approximately three to nine millimeters, a width of approximately one millimeter, and a height of approximately one hundred microns. A suitable QC gain medium 22 can be purchased from Alpes Lasers, located in Switzerland.

In one embodiment, the QC gain medium 22 includes (i) a first facet 22A that faces the cavity optical assembly 26 and the WS feedback assembly 28, and (ii) a second facet 22B that faces the output optical assembly 24. In this embodiment, the QC gain medium 22 emits from both facets 22A, 22B along a lasing axis 22C (e.g., parallel to the Z axis). In one embodiment, the first facet 22A is coated with an anti-reflection ("AR") coating and the second facet 22B is coated with a reflective coating. The AR coating on the first facet 22A allows light directed from the QC gain medium 22 at the first facet 22A to easily exit the QC gain medium 22 and allows the light reflected from the WS feedback assembly 28 to easily enter the QC gain medium 22. In contrast, the reflective coating on the second facet 22B reflects at least some of the light that is directed at the second facet 22B from the QC gain medium 22 back into the QC gain medium 22. In one non-exclusive embodiment, the AR coating can have a reflectivity of less than approximately one percent, and the reflective coating can have a reflectivity of between approximately one and ninety-five percent. In this embodiment, the reflective coating on the second facet 22B acts as an output coupler for the external cavity.

The cavity optical assembly 26 is positioned between the QC gain medium 22 and the WS feedback assembly 28 along the lasing axis 22C, and collimates and focuses the light that passes between these components. In certain embodiments, the cavity optical assembly 26 can include one lens or more than one lens. For example, in one embodiment, the cavity optical assembly 26 can include an aspherical lens having an optical axis that is aligned with the lasing axis 22C. Moreover, in some embodiments, to achieve the desired small size and portability, the lens has a relatively small diameter. In alternative, non-exclusive embodiments, the lens has a diameter of less than approximately ten millimeters in diameter. The lens can comprise materials selected from the group of Ge, ZnSe, ZnS Si, CaF, BaF or chalcogenide glass. However, other materials may also be utilized. The lens may be made using a diamond turning or molding technique. The lens can be designed to have a relatively large numerical aperture (NA). For example, the lens can have a numerical aperture in the range of 0.6 to 0.95.

The output optical assembly 24 is positioned between the QC gain medium 22 and the window (not shown) in line with the lasing axis 22C. Additionally, the output optical assembly 24 collimates and focuses the light that exits the second facet 22B of the QC gain medium 22. For example, in certain embodiments, the output optical assembly 24 can include one lens or more than one lens that can be somewhat similar in design to the lens or lenses of the cavity optical assembly 26.

The WS feedback assembly 28 reflects light back to the QC gain medium 22 along the lasing axis 22C, and is used to precisely adjust the lasing frequency of the external cavity and the wavelength of the output beam 12. Thus, in the external cavity arrangements disclosed herein, the WS feedback assembly 28 dictates what wavelength will experience the most gain and thus dominate the wavelength of the output beam 12.

The design of the WS feedback assembly 28 can vary pursuant to the teachings provided herein. FIG. 3C illustrates only a portion of the WS feedback assembly 28, including a diffraction grating 46, and a portion of the grating mover assembly 48 that precisely moves the grating 46. In this embodiment, the grating 46 cooperates with the reflective coating on the second facet of the QC gain medium 22 to form the external cavity. The term external cavity is utilized to designate the grating positioned outside of the QC gain medium 22.

The diffraction grating 46 can include a glass or polished metal grating face surface having a large number of very fine parallel grooves or slits that have a grating period ("GP"). With this design, movement of the grating face relative to the gain medium 22 and the incident beam changes the angle of incidence of the incident beam onto the grating 46 and the wavelength of the light in the external cavity. In this embodiment, changing the incidence angle serves to preferentially select a single wavelength which is the first order diffracted light from the grating 46. This light is diffracted back onto the same path as the incident beam to thereby tune the external cavity to the diffracted wavelength. The diffracted laser light is received by the gain medium 22 to provide stimulated laser emission thereby resonating the gain medium 22 with the grating selected wavelength. With this design, the position of the grating 46 dictates what wavelength will experience the most gain and thus dominate the wavelength of the output beam 12 (illustrated in FIG. 1).

As provided herein, the physical length of the external cavity is equal to the physical distance that a ray of light travels between the second facet and the grating 46. Further, the optical length of the external cavity is equal to the physical lengths of the areas that ray of light travels through in the external cavity times the individual indexes of refraction of each of the areas. The external cavity optical length takes in account the index of refraction of all objects in the external cavity that influence the movement of the ray in the external cavity.

In one embodiment, the grating mover 48 selectively moves (e.g. pivots) the grating 46 to rapidly adjust the lasing frequency of the gain medium 22 and the wavelength of the output beam 12. In this embodiment, the grating 46 is selectively pivoted by the grating mover 48 about a pivot axis 52 (e.g. the X axis in this example) that is perpendicular to the lasing axis (the Z axis in FIG. 3C).

With reference to U.S. Pat. No. 7,733,925, continuous wavelength tuning without mode hops is accomplished by proper motion of a diffraction grating 46 with respect to the gain medium 22 and the cavity collimator 26. More specifically, U.S. Pat. No. 7,733,925 provides the proper motion of the grating can be realized either by (i) rotation of the grating with respect to the properly selected pivot axis, or (ii) rotation around the properly selected pivot axis accompanied by the arbitrary motion of the pivot axis in a pivot plane. As far as permitted, the contents of U.S. Pat. No. 7,733,925 are incorporated herein by reference.

With at least some of the designs provided herein, the grating 46 is rotated about the properly selected pivot axis 52 that is defined in U.S. Pat. No. 7,733,925. Thus, with these designs, the wavelength tuning of the laser assembly 10 occurs without mode hops. With this design, the laser assembly 10 is able to accurately, finely, and smoothly tune throughout the spectral range without the influence of the cavity modes.

The angular range of the grating mover 48 can be varied according to the design of the grating 46 and the desired spectral range of the laser assembly 10. In one non-exclusive embodiment, the grating mover 48 has an angular range plus or minus four degrees (±4°). The present design is very compact for this level of angular range.

In certain embodiments, the grating pivot axis 52 is parallel to the plane of laser sled. This can be beneficial in terms of favorable polarization of QC gain medium 22.

In certain embodiments, the gain medium 22 and the physical length of the external cavity are each relatively short. In one embodiment, the gain medium 22 has a length of approximately 1.5 millimeters and the physical length of the external cavity varies from approximately Lowest optical (and physical) length: 16.7 millimeters (and 7.9 millimeters), Middle optical (and physical) length: 19.2 millimeters (and 10.4 millimeters), and Longest optical (and physical) length: 22.1 millimeters (and 13.3 millimeters). In another embodiment, the gain medium 22 has a length of approximately 0.75 millimeters and the physical length of the external cavity varies from approximately Lowest optical (and physical) length: 16.7 millimeters (and 10.7 millimeters), Middle optical (and physical) length: 19.2 millimeters (and 13.2 millimeters), and Longest optical (and physical) length: 22.1 millimeters (and 16.1 millimeters). Alternatively, the gain medium 22 can have a length of approximately 0.5, 0.75, 1, or 1.25 millimeters and the physical length of the external cavity can be adjusted accordingly.

Figure 3D:
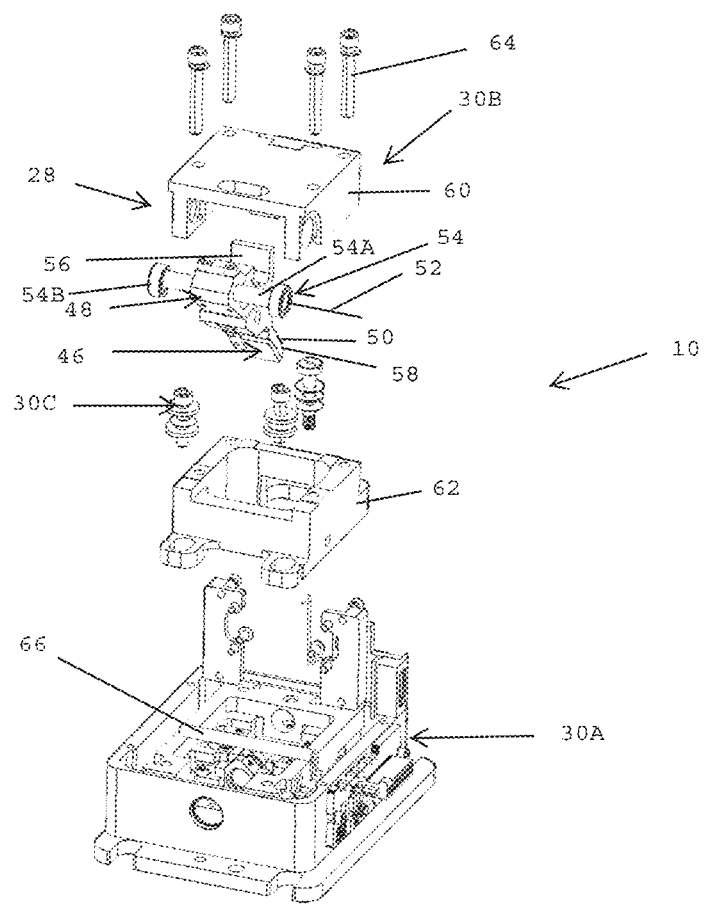
FIG. 3D is an exploded perspective view of the components of a second module assembly.

FIG. 3D is another exploded perspective view of the laser assembly 10. More specifically, FIG. 3D illustrates the second module assembly 30B (e.g. the WS feedback assembly 28) exploded away from the first module assembly 30A, and the module fastener assembly 30C.

FIG. 3D illustrates that the WS feedback assembly 28 includes (i) the grating 46, (ii) the grating mover assembly 48, and (iii) the grating position sensor 50 that continuously monitors the position of the grating. The position sensor 50 allows for closed loop control of the mover assembly 48. For example, the grating position sensor 50 can be a position sensor (position sensitive device—PSD) such as an encoder, a light-based PSD, a capacitive sensor, a magnetic sensor, an inductive sensor or any combination thereof. In one, non-exclusive embodiment, the position sensor 50 can include a laser diode that moves with the grating 46 and a position sensitive detector that is illuminated by the laser diode. The position sensitive detector can be fixed to the upper frame 60. For example, the laser diode can be mounted on the back side near a distal end of an arm assembly 58 described below.

In one embodiment, the grating mover assembly 48 includes a pivot assembly 54, a mover 56, an arm assembly 58, an upper frame 60 (also referred to as a first frame or a second frame), and an intermediate frame 62. The design of each of these components can be varied.

The mover 56 selectively pivots the arm assembly 58 and the grating 46 about the pivot axis 52. In one embodiment, the mover 56 is a dual acting (driven in both direction) voice coil motor that includes a conductor array 56A (illustrated in FIG. 2A) and a magnet array 56B (illustrated in FIG. 2A). One of the arrays is secured to the arm assembly 58 and the other of the arrays is secured to the upper frame 60. For example, the conductor array 56A can be secured to the arm assembly 58, and the magnet array 58A can be secured to the upper frame 60. Alternatively, the conductor array can be secured to the upper frame 60, and the magnet array can be secured to the arm assembly 58. With this design, the laser assembly 10 is a voice-coil driven, QC gain medium Littrow cavity. The voice coil mover 56 is very compact, fast, and precise. Alternatively, the mover 56 can be stepper motor or another type of actuator. It should be noted that the conductor array 56A and the magnet array 56B can be referred to as a first mover component or a second mover component.

In this embodiment, the heat from the mover 56 is transferred to the first module assembly 30A that is thermally managed.

Figure 4A:
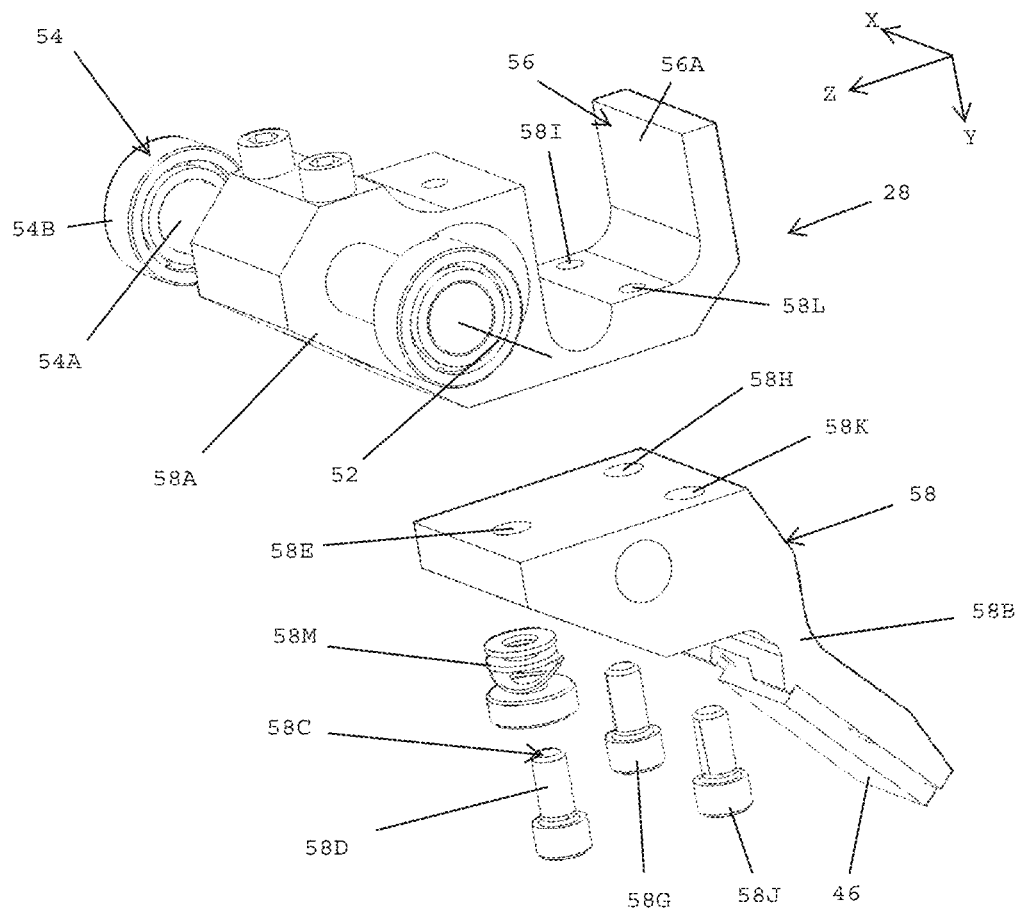
FIGS. 4A and 4B are alternative, exploded perspective views of an arm assembly having features of the present invention.

FIG. 4A is an exploded perspective of a portion of the WS feedback assembly 28. As illustrated in FIG. 4A, the pivot assembly 54 includes a pivot shaft 54A that fixedly retains the arm assembly 58, and a pair of spaced apart bearings 54B that are centered on the pivot axis 52. In this embodiment, the pivot assembly 54 causes the arm assembly 58 and the grating 46 to pivot about the pivot axis 52. With this design, the arm assembly 58 pivots about the pivot axis 52 without a flexure.

The arm assembly 58 is secured to the pivot shaft 52A and retains the grating 46. In one embodiment, the arm assembly 58 includes a proximal arm section 58A that is fixedly secured to the pivot shaft 52A, a distal arm section 58B that retains the grating 46, and an arm connector assembly 58C that selectively connects the sections 58A, 58B together. In this embodiment, one array (e.g. the conductor array 56A) of the mover 56 is fixedly secured to the proximal arm section 58A. In certain embodiments, the arm assembly 58 is balanced about pivot axis 52.

Figure 4B:
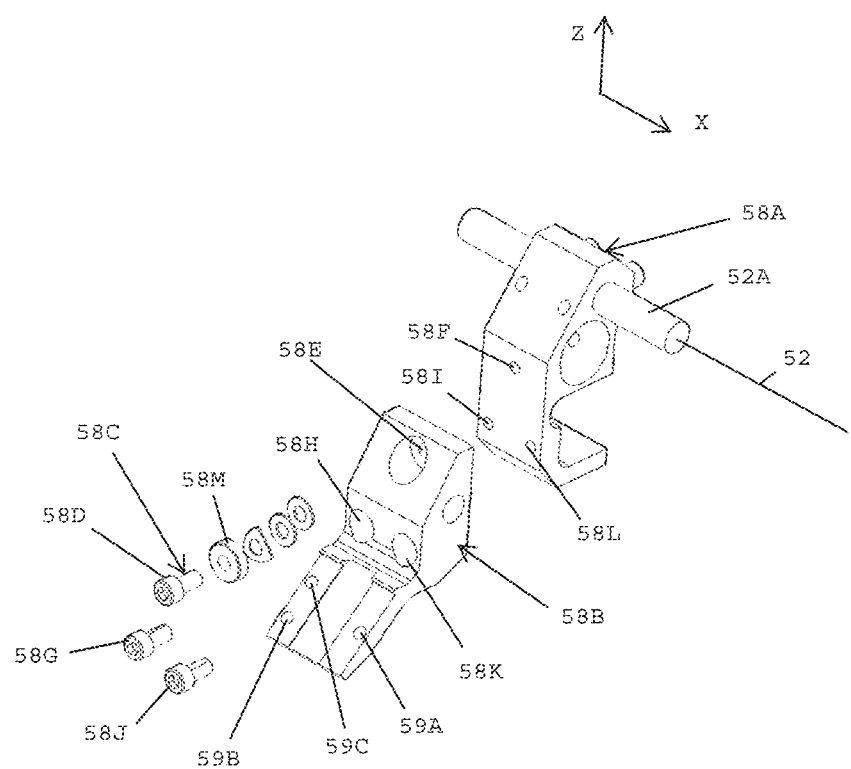

FIG. 4B is an exploded perspective view of the a proximal arm section 58A that is fixedly secured to the pivot shaft 52A, the distal arm section 58B that retains the grating 46 (not shown in FIG. 4B), and the arm connector assembly 58C.

FIGS. 4A and 4B illustrate that the arm connector assembly 58C includes (i) a first arm fastener 58D (e.g. a threaded bolt) that extends through a first aperture 58E in the distal arm section 58B and selectively threads into a first internally threaded surface 58F in the proximal arm section 58A; (ii) a second arm fastener 58G (e.g. a threaded bolt) that extends through a second aperture 58H in the distal arm section 58B and selectively threads into a second internally threaded surface 58I in the proximal arm section 58A; and (iii) a third arm fastener 58J (e.g. a threaded bolt) that extends through a third aperture 58K in the distal arm section 58B and selectively threads into a third internally threaded surface 58L in the proximal arm section 58A. In this embodiment, the first aperture 58E is a controlled bore, and the second and third apertures 58H, 58K are oversized holes. With this design, the distal arm section 58B can be pivoted about the arm fastener 58D to move about the Y axis relative to the proximal arm section 58A so that the plane of the face of the grating 46 is properly aligned with the pivot axis 52. After the distal arm section 58B is properly positioned relative to the proximal arm section 58A, the arm fasteners 58D, 58G, 58J can be fully tightened.

Additionally, one or more of the fasteners 58D, 58G, 58J can include one or more washer stacks 58M that facilitate tightening of the respective fasteners 58D, 58G, 58J without moving the distal arm section.

As is known, gratings 46 are very fragile and can be damaged quite easily. The present two piece arm assembly 58 design allows the WS feedback assembly 28 to be assembled and tested with a dummy (properly weighted) arm section (not shown) that does not include the grating 46. For example, the mover 56 coupled to the proximal arm section 58A and the grating position sensor 50 can be fully tested with the dummy arm section (instead of the distal arm section 58B and grating 46). Subsequently, prior to assembly of the two module assemblies 30A, 30B, the dummy arm section can be replaced with the distal arm section 58B.

The grating 46 can be attached to the distal arm section 58B with a grating fastener assembly (not shown in FIGS. 4A and 4B) that allows for adjustment of the grating 46 relative to the distal arm section 58B. In one, non-exclusive embodiment, the distal arm section 58B includes a first aperture 59A, a second aperture 59B, and a third aperture 59C that are used to secure an alignment tool (not shown in FIGS. 4A and 4B) to the distal arm section 58B, and the alignment tool can be used to align the grating 46. With this design, the grating 46 can be precisely moved relative to the distal arm section 58B to align the grating grooves of the grating 46 relative to the arm assembly 58. After the grating 46 is properly positioned relative to the distal arm section 58B, the grating 46 can be fixedly secured with a grating fastener (not shown in FIGS. 4A and 4B) (e.g. an adhesive as a non-exclusive embodiment) to the distal arm section 58B.

Figure 4C:
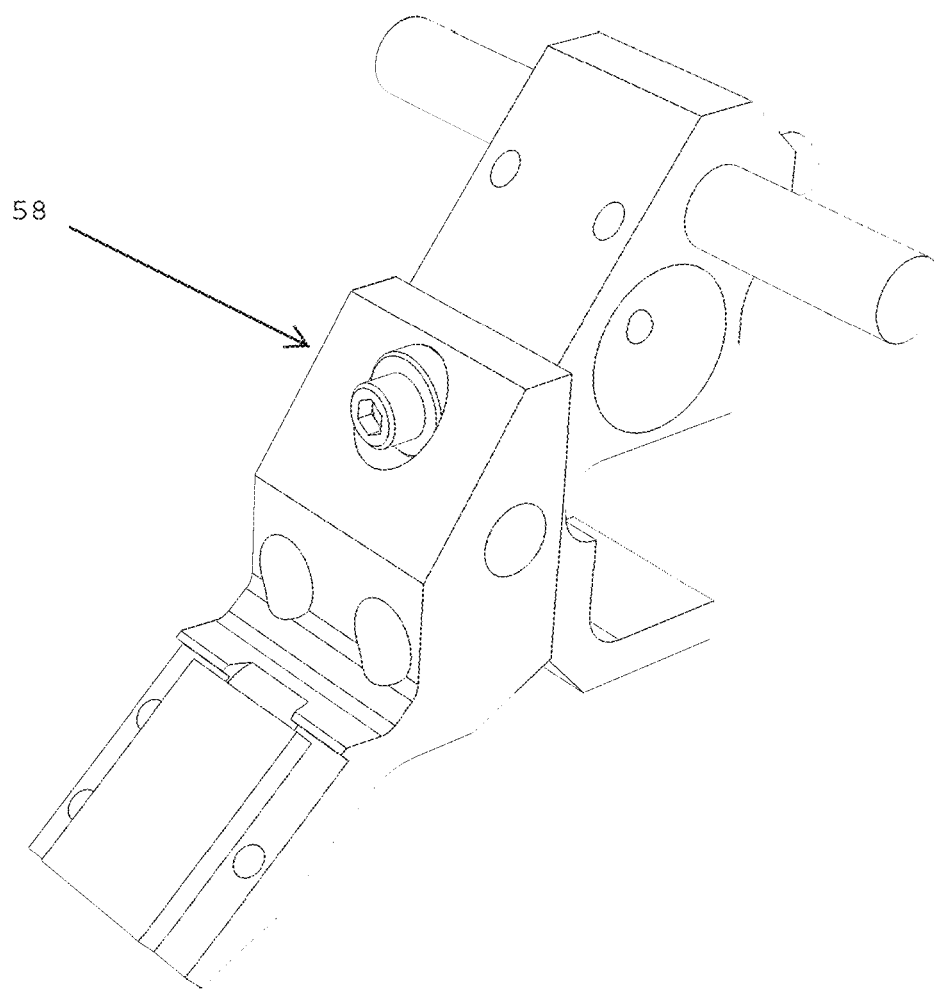
FIG. 4C is a perspective view of the arm assembly.

FIG. 4C is a perspective view of the arm assembly 58.

Referring back to FIG. 3D, the upper frame 60 retains the bearings 54B of the pivot assembly 54 and one of the components of the mover 56. In this embodiment, the upper frame 60 is fixedly secured to the intermediate frame with a frame fastener assembly 64, e.g. four spaced apart bolts).

The intermediate frame 62 is generally rectangular frame shaped. In this embodiment, the module fastener assembly 30C is used to fixedly secure the intermediate frame 62, the upper frame 60, and the rest of the WS feedback assembly 28 to the first module assembly 30A.

FIG. 5 is an exploded perspective view of the intermediate frame 62, the module fastener assembly 30C, and the mounting frame 16. In this embodiment, the module fastener assembly 30C includes (i) a first module fastener 30D (e.g. a threaded bolt) that extends through a first aperture 30E in the intermediate frame 62 and selectively threads into a first internally threaded surface 30F in the mounting frame 16; (ii) a second module fastener 30G (e.g. a threaded bolt) that extends through a second aperture 30H in the intermediate frame 62 and selectively threads into a second internally threaded surface 58I in the mounting frame 16; and (iii) a third mounting fastener 30J (e.g. a threaded bolt) that extends through a third aperture 30K in the intermediate frame 62 and selectively threads into a third internally threaded surface 30L in the mounting frame 16. In this embodiment, the first aperture 30E is an elongated slot, and the second and third apertures 30H, 30K are oversized holes. With this design, the intermediate frame 62 and the rest of the second module assembly 30B (i) can be slid along the Z axis relative to the mounting frame 16 and the rest of first module assembly 30A to selectively adjust the cavity length, and (ii) can be pivoted about the Y axis relative to the mounting frame 16 and the rest of the first module assembly 30A so that the plane of the face of the grating 46 and the pivot axis 52 are properly aligned relative to the lasing axis. After the second module assembly 30B is properly positioned relative to the first module assembly 30A, the module fasteners 30D, 30G, 30J can be fully tightened.

Additionally, one or more of the fasteners 30D, 30G, 30J can include one or more washer stacks 30M that facilitate tightening of the respective fasteners 30D, 30G, 30J without moving the second module assembly 30B.

Additionally, referring to FIG. 3D, the assembly 10 can include an arm support 66 that is secured to the first module assembly 30A. In this embodiment, the arm support 66 is a solid rod that provides support (a rest stop) for the arm assembly 58 when power is off, and the mover 56 is not actuated.

Figure 6:
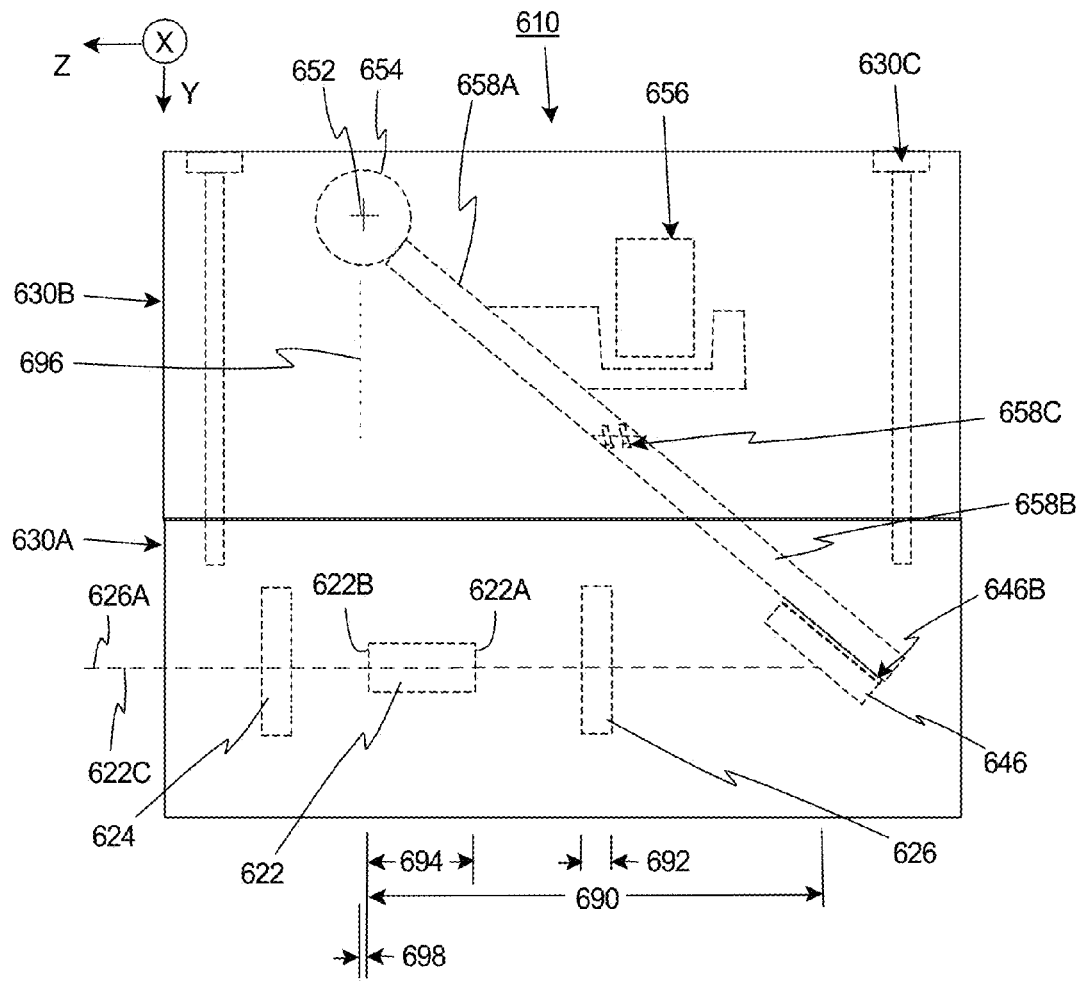
FIG. 6 is a simplified illustration of the laser assembly.

FIG. 6 is a simplified schematic illustration of the laser assembly 610 including the (i) the first module assembly 630A including the optical assemblies 624, 626, and the gain medium 622 including the facets 622A, 622B; (ii) the second module assembly 630B including the grating 646, the arm assembly 658, the mover 656, and the pivot assembly 654; and (iii) the module fastener assembly 630C. With this design, the module fastener assembly 630C is moveable between (i) an unlocked position in which the second module assembly 630B can be selectively moved relative to the first module assembly 630A (parallel to the Z axis) to selectively adjust the cavity length 690, and moved (about the Y axis) to adjust the pivot axis 652 to be approximately normal to the lasing axis 622C (parallel to the Z axis); and (ii) a locked position in which the second module assembly 630B is fixedly secured to the first module assembly 630A to inhibit relative movement.

Further, the arm assembly 658 includes (i) the proximal arm section 658A; (ii) the distal arm section 658B, and (iii) the arm connector assembly 658C that is moveable between an unlocked position in which the distal arm section 658B can be moved relative to the proximal arm section 658A about the Y axis to adjust the plane of the grating face 646A of the grating 646 so that the grating face 646A is properly aligned with the pivot axis 652; and a locked position in which the distal arm section 658B is fixedly secured to the proximal arm section 658A to inhibit relative movement between the distal arm section 658B and the proximal arm section 658A.

Moreover, the second module assembly 630B can include a grating fastener 646B that allows the grating 646 to be moved relative to the distal arm section 658B to align the grating grooves of the grating 646 to the arm assembly 658, and subsequently fixedly secure the grating 646 to the distal arm section 658B to inhibit relative movement between the grating 646 and the distal arm section 658B. For example, the grating fastener 646B can be an adhesive that fixedly attaches the grating 646 to the distal arm section 658B.

With the present design, (i) roll and yaw can be adjusted, (ii) yaw can be adjusted in two positions to allow for complete yaw adjustment, (iii) pivot axis yaw and grating yaw can be adjusted independently. Stated in another fashion, the four degrees of freedom that can be adjusted with regards to the external cavity (all with external tooling in certain embodiments) are as follows: (i) alignment of the grating grooves of the grating 646 relative to the arm assembly 658; (ii) the alignment/rotation of the distal arm section 658B about fastener 58D (illustrated in FIG. 4B) relative to the proximal arm section 658B and the pivot axis 652; (iii) alignment of the rotation of pivot axis 652 relative to the first module assembly 630A around the Y axis; and (iv) adjustment of the cavity length 690 since the second module assembly 630B slides along the Z axis relative to the first module assembly 630A. As a non-exclusive example, the cavity length 690 can be adjusted along the z axis by approximately plus or minus one millimeter (+/−1 mm).

It should be noted in the unlocked position for each assembly 630C, 658C, the respective fasteners are only loosened to allow for movement, and the fasteners are still connecting the components together. Alternatively, in the locked position, the respective fastener assemblies 630C, 658C are tightened to inhibit relative movement.

As provided above, with reference to U.S. Pat. No. 7,733,925, continuous wavelength tuning without the influence of the cavity modes is accomplished by proper motion of a diffraction grating 646 with respect to the gain medium 622 and the cavity collimator 626.

More specifically, U.S. Pat. No. 7,733,925 provides the proper motion of the grating can be realized either by (i) rotation of the grating with respect to the properly selected pivot axis, or (ii) rotation around the properly selected pivot axis accompanied by the arbitrary motion of the pivot axis in a pivot plane. As far as permitted, the contents of U.S. Pat. No. 7,733,925 are incorporated herein by reference.

As provided herein, the physical length of the external cavity is equal to the physical distance that a ray of light travels between the second facet 622B and the grating 646. Further, the optical length of the external cavity is equal to the physical lengths of the areas that ray of light travels through in the external cavity times the individual indexes of refraction of each of the areas. The external cavity optical length takes in account the index of refraction of all objects in the external cavity that influence the movement of the ray in the external cavity.

Any optical ray propagating toward the gain medium 622 will travel the same group optical length Lo to the optical output coupler. Lo is defined as $L\_opt = \sum_i (L_i \cdot n_i)$; where Li and ni are a physical length and group index of every media along the said optical ray propagation path from Plane A to the output coupler, respectively. Group index is an optical property of the medium, know to those skilled in art.

In certain embodiments, where the gain medium 622 has a straight waveguide, and both facets 622A, 622B are normal to the waveguide, a partially reflecting second facet 622B being the output coupler, and a single cavity collimator 626 being located coaxially (optical axis 626A coaxial with lasing axis 622C of the gain medium 622, the Lo is reduced to L_lens*n_lens+L_gain*n_gain (where L_lens 692 is the physical length of the collimator, n_lens is the group index of refraction of the collimator, L_gain 694 is the physical length of the gain medium 622, and n_gain is the group index of refraction of the gain medium), and the plane A is coincident with an apex of the collimator surface facing the grating 646 and normal to the direction of propagation of the collimated beam.

In this embodiment, to achieve smooth tuning, the pivot axis 652 is located approximately in a pivot plane 696 (illustrated as a dotted line) that is normal to the optical axis 626A (and parallel to the facets 622A, 622B), the pivot plane 696 is spaced apart from the second facet 622B a separation distance 698 that is calculated using the following formula: separation distance=L_lens*(n_lens−1)+L_media*(n_gain−1); where L_lens 692 is the physical length of the cavity collimator 626, n_lens is the group index of refraction of the cavity collimator, L_gain 694 is the physical length of the gain medium 622, and n_gain is the group index of refraction of the gain medium 622.

In alternative, non-exclusive embodiments, the gain medium can have a physical length between the facets of approximately 1.5 millimeters; and laser assembly can be designed so that the external cavity has a physical length of less than approximately ten (10), twenty (20), thirty (30), forty (40), or fifty (50) millimeters. Alternatively, the gain medium can have a physical length of approximately 0.5, 0.75, 1, or 1.25 millimeters and the external cavity physical length can be reduced accordingly.

Referring back to FIGS. 1A and 2A, the control system 15 can be used to control the operation of the components of the laser assembly 10, including one or more of the gain medium 22, the temperature controller 20, and/or the mover 56. Further, the control system 15 can receive feedback regarding the gain medium 22, temperature, and/or the position of the grating 46 to control these components. The control system 15 can direct power to the gain medium 22 is a pulsed fashion or constant wavelength.

In one embodiment, the control system 15 is secured to the laser housing 14 and is positioned completely outside the laser housing 14. With this design, the control system 15 can be accessed without opening the laser housing 14, the control system 15 is relatively isolated from the heat and noise generated by the gain medium 22, and the control system 15 is still very close to the gain medium 22.

The design of the control system 15 can be varied as provided herein. In one embodiment, the control system 15 includes a circuit connector 15A, a circuit board 15B, a driver circuit 15C, and a sensing circuit 15D. In one, non-exclusive embodiment, the circuit board 15B can be fixedly secured to the laser housing 14 with a pair of fasteners 15E that are threaded into the laser housing 14.

The circuit connector 15A provides an easy and quick way to connect and disconnect the control system 15 to the higher level controller. In one non-exclusive embodiment, the circuit connector 15A is a female pin connector.

The driver circuit 15C includes the electronics that direct a drive current to the gain medium 22 and the mover 56. The sensing circuit 15D provides feedback relating to the operation of the gain medium 22 and this feedback is used for closed loop control of the gain medium 22. Further, the sensing circuit 15D can receive feedback regarding the position of the grating 46 for closed loop control of the mover 56.

In certain embodiments, a higher level controller (not shown) provides power to the laser assembly 10, and includes circuitry to drive the one or more temperature controllers 20. Further, the higher level controller can process the signals from the temperature sensor(s) for closed loop control of the temperature controller(s) 20. Additionally, in certain embodiments, the higher level controller can be used as an upper level controller for multiple different laser assemblies 10.

Additionally, the control system 15 can include one or more USB connectors 15F for power the mover 56, and other components.

In certain embodiments, the laser assembly 10 can be calibrated at a plurality of grating positions so that the wavelength of the output beam can be determined by measuring the grating position. For example, a look-up table can be utilize. Further, the information can be stored in the control system 15.

Figure 7:
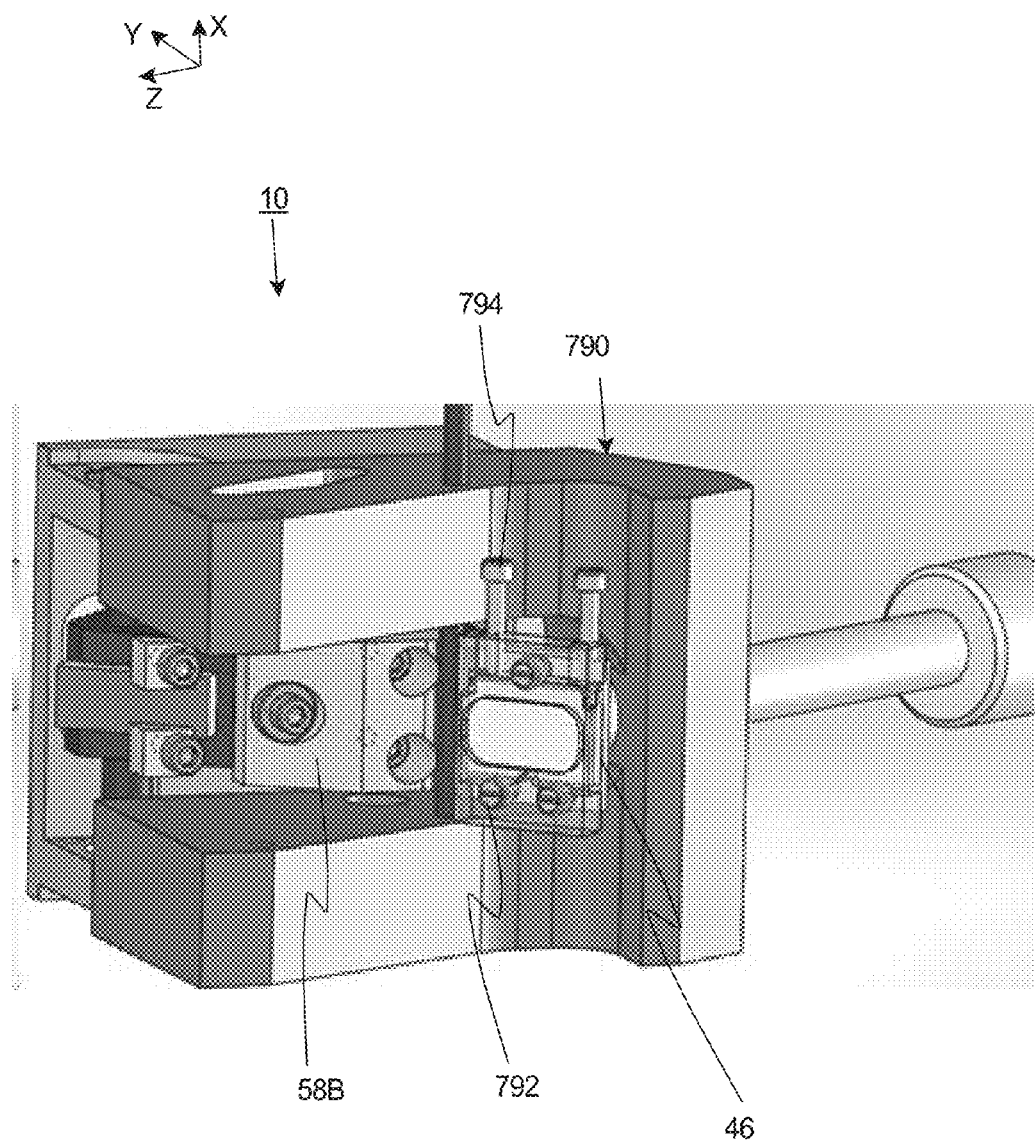
FIG. 7 is a perspective illustration of a portion of the laser assembly and an alignment tool used to adjust the laser assembly.

FIG. 7 is a perspective illustration of a portion of the laser assembly 10, and an alignment tool 790 that can be used to adjust, align, and secure the grating 46 to the distal arm section 58B. In this embodiment, the alignment tool 790 can be temporarily secured to the distal arm section 58B with three fasteners 792 that are threaded into apertures 59A, 59B, 59C (illustrated in FIG. 4B) in the distal arm section 58B. In one embodiment, the alignment tool 790 can include one or more alignment screws 794 that engage the side of the grating 46. With this design, with the grating 46 not yet secured to the distal arm section 58B, the alignment screws 794 can be controlled to precisely engage the side of the grating 46 to rotate the grating 46 relative to the distal arm section 58B. After the grooves of the grating 46 are properly aligned, it can be fixedly secured with the grating fastener 646B (illustrated in FIG. 6) to the distal arm section 58B. Subsequently, the three fasteners 792 can be removed to remove the alignment tool 790. Thus, with the present invention, the grating 46 is movable relative to the distal arm section 58B to center and align the grating 46.

While a number of exemplary aspects and embodiments of a laser assembly 10 have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A laser assembly for emitting an output beam, the laser assembly comprising:
    a first module assembly that includes (i) a rigid first frame; and (ii) a gain medium coupled to the first frame, the gain medium having a first facet and a second facet, the gain medium generating a beam that exits the facets along a lasing axis when sufficient current is directed to the gain medium;
    a second module assembly that includes (i) a rigid second frame; (ii) a diffraction grating positioned in the path of the beam exiting the first facet to form an external cavity having a cavity length, the diffraction grating redirecting at least a portion of the beam back to the gain medium, the diffraction grating having a grating face and grating grooves; (iii) an arm assembly that retains the grating; (iv) a pivot assembly that secures the arm assembly to the second frame in a fashion that allows the arm assembly and the grating to effectively pivot about a pivot axis; and (v) a mover that selectively moves the arm assembly and the grating about the pivot axis; and a module fastener assembly that is moveable between (i) an unlocked position in which the second frame can be selectively moved relative to the first frame to selectively adjust the cavity length, and to adjust the pivot axis to be approximately normal to the lasing axis; and (ii) a locked position in which the second module assembly is fixedly secured to the first module assembly to inhibit relative movement between the first frame and the second frame.

2. The laser assembly of claim 1 wherein the arm assembly includes (i) a proximal arm section that is secured to the second frame with the pivot assembly; (ii) a distal arm section that retains the diffraction grating; and (iii) an arm connector assembly that is moveable between an unlocked position in which the distal arm section can be moved relative to the proximal arm section to adjust the plane of the grating face so that the grating face is properly aligned with the pivot axis; and a locked position in which the distal arm section is fixedly secured to the proximal arm section to inhibit relative movement between the distal arm section and the proximal arm section.

3. The laser assembly of claim 1 wherein the grating can be rotated relative to the arm assembly and subsequently locked to the arm assembly.

4. The laser assembly of claim 1 wherein the mover includes a first mover component that is coupled to the arm assembly and a second mover component that is coupled to the second frame, wherein current directed to one of the mover components causes the first mover component and the arm assembly to move relative to the second frame.

5. The laser assembly of claim 4 wherein the mover is a voice coil motor that directly engages the proximal arm section.

6. The laser assembly of claim 4 wherein the mover is controlled to pivot the arm assembly back and forth in a simple harmonic motion.

7. The laser assembly of claim 1 further comprising a temperature controller that is in thermal communication with the first frame, the temperature controller controlling the temperature of the first frame and the gain medium.

8. The laser assembly of claim 1 wherein the gain medium is a quantum cascade type gain medium.

9. The laser assembly of claim 1 further comprising a cavity optical assembly positioned between the gain medium and the grating, the cavity optical assembly having an optical axis; wherein the pivot axis is located approximately in a pivot plane that is normal to the optical axis, the pivot plane being spaced apart from the second facet a separation distance that is calculated using the following formula:

$$\text{separation distance} = L\_lens \ast (n\_lens - 1) + L\_media \ast (n\_gain - 1)$$

where L_lens is the physical length of the cavity collimator, n_lens is the group index of refraction of the cavity collimator, L_gain is the physical length of the gain medium, and n_gain is the group index of refraction of the gain medium.

10. The laser assembly of claim 9 wherein, the gain medium has a length between the facets of approximately 1.5 millimeters and wherein the physical length of the external cavity is less than approximately thirty millimeters.

11. A laser assembly for emitting an output beam that includes a set of output pulses of energy, with at least some of the output pulses of energy having a different center wavelength, the laser assembly comprising:

a first module assembly that includes (i) a rigid first frame; and (ii) a gain medium coupled to the first frame, the gain medium having a first facet and a second facet, the gain medium generating a beam that exits the facets along a lasing axis when sufficient current is directed to the gain medium; and a second module assembly that includes (i) a rigid second frame; (ii) a diffraction grating positioned in the path of the beam exiting the first facet to form an external cavity having a cavity length, the diffraction grating redirecting at least a portion of the beam back to the gain medium, the diffraction grating having a grating face and grating grooves; (iii) an arm assembly that retains the grating; (iv) a pivot assembly that secures the arm assembly to the second frame in a fashion that allows the arm assembly and the grating to effectively pivot about a pivot axis; and (v) a mover that selectively moves the arm assembly and grating about the pivot axis; and wherein the second module assembly is moveable relative to the first module assembly to selectively adjust the cavity length, and to adjust the pivot axis to be approximately normal to the lasing axis;

wherein the arm assembly includes (i) a proximal arm section that is secured to the second frame with the pivot assembly; (ii) a distal arm section that retains the diffraction grating; and wherein, the distal arm section is movable relative to the proximal arm section to adjust the plane of the grating face so that the grating face is properly aligned with the pivot axis; and wherein the grating is movable relative to the distal arm section to align the grating grooves of the grating to the arm assembly.

12. The laser assembly of claim 11 wherein the mover includes a first mover component that is coupled to the arm assembly and a second mover component that is coupled to the second frame, wherein current directed to one of the mover components causes the first mover component and the arm assembly to move relative to the second frame, and wherein the mover is a voice coil motor.

13. The laser assembly of claim 12 wherein the mover is controlled to pivot the arm assembly back and forth in a simple harmonic motion.

14. The laser assembly of claim 11 further comprising a cavity optical assembly positioned between the gain medium and the grating, the cavity optical assembly having an optical axis; wherein, the gain medium has a length between the facets of approximately 1.5 millimeters and wherein the physical length of the external cavity is less than approximately thirty millimeters, and wherein the pivot axis is located approximately in a pivot plane that is normal to the optical axis, the pivot plane being spaced apart from the second facet a separation distance that is calculated using the following formula:

$$\text{separation distance} = L\_lens \ast (n\_lens - 1) + L\_media \ast (n\_gain - 1)$$

where L_lens is the physical length of the cavity collimator, n_lens is the group index of refraction of the cavity collimator, L_gain is the physical length of the gain medium, and n_gain is the group index of refraction of the gain medium.

15. A method for generating an output beam, the method comprising the steps of:

providing a first module assembly that includes (i) a rigid first frame; and (ii) a gain medium coupled to the first frame, the gain medium having a first facet and a second facet, the gain medium generating a beam that exits the facets along a lasing axis when sufficient current is directed to the gain medium;

providing a second module assembly that includes (i) a rigid second frame; (ii) a diffraction grating positioned in the path of the beam exiting the first facet to form an external cavity having a cavity length, the diffraction grating redirecting at least a portion of the beam back to the gain medium, the diffraction grating having a grating face and grating grooves; (iii) an arm assembly that retains the grating; (iv) a pivot assembly that secures the arm assembly to the second frame in a fashion that allows the arm assembly and the grating to effectively pivot about a pivot axis; and (v) a mover that selectively moves the arm assembly and grating about the pivot axis;

selectively moving the second frame relative to the first frame to selectively adjust the cavity length, and to adjust the pivot axis to be approximately normal to the lasing axis; and fixedly securing the second module assembly to the first module assembly to inhibit relative movement between the first frame and the second frame.

16. The method of claim 15 wherein the arm assembly includes (i) a proximal arm section that is secured to the second frame with the pivot assembly; (ii) a distal arm section that retains the diffraction grating; and wherein the method includes the steps of moving the distal arm section relative to the proximal arm section to adjust the plane of the grating face so that the grating face is properly aligned with the pivot axis, and fixedly securing the distal arm section to the proximal arm section to inhibit relative movement between the distal arm section and the proximal arm section.

17. The method of claim 15 further comprising the steps of moving the grating relative to the arm assembly lasing axis, and fixedly securing the grating to the arm assembly.

* * * * *